United States Patent
Soraoka et al.

(10) Patent No.: US 6,188,935 B1
(45) Date of Patent: Feb. 13, 2001

(54) VACUUM PROCESSING APPARATUS AND SEMICONDUCTOR MANUFACTURING LINE USING THE SAME

(75) Inventors: Minoru Soraoka, Yamuguchi; Ken Yoshioka, Hikari; Yoshinao Kawasaki, Yamaguchi, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/151,795

(22) Filed: Sep. 22, 1998

Related U.S. Application Data

(62) Division of application No. 08/677,682, filed on Jul. 8, 1996, now Pat. No. 5,855,726.

(30) Foreign Application Priority Data

Jul. 19, 1995 (JP) .................................................. 7-182921

(51) Int. Cl.$^7$ ........................................................ G06F 17/00
(52) U.S. Cl. ............................ 700/229; 700/228; 700/218; 414/939; 414/937
(58) Field of Search ....................... 364/478.17, 478.16, 364/478.1, 478.08, 478.06, 478.05, 478.04, 478.03, 478.01; 414/220, 939, 936, 937, 935; 700/229

(56) References Cited

U.S. PATENT DOCUMENTS

| | | | |
|---|---|---|---|
| 5,024,570 | * 6/1991 | Kiriseko et al. | 414/222 |
| 5,256,204 | 10/1993 | Wu | 118/719 |
| 5,280,983 | * 1/1994 | Maydan et al. | 294/119.1 |
| 5,314,509 | 5/1994 | Kato et al. | 34/406 |
| 5,478,195 | * 12/1995 | Usami | 414/786 |
| 5,512,320 | 4/1996 | Turner et al. | 427/255 |
| 5,527,390 | 6/1996 | Ono et al. | 118/719 |
| 5,536,128 | 7/1996 | Shimoyashiro | 414/273 |
| 5,563,798 | * 10/1996 | Berken et al. | 364/448.06 |
| 5,570,990 | 11/1996 | Bonora | 414/543 |
| 5,611,655 | * 3/1997 | Fukasawa et al. | 414/217 |
| 5,663,884 | * 9/1997 | Nishihata et al. | 364/478.16 |
| 5,672,239 | 9/1997 | Deornellas | 156/625.1 |
| 5,691,907 | * 11/1997 | Resler et al. | 364/478.01 |
| 5,695,564 | 12/1997 | Imahashi | 118/719 |
| 5,740,052 | * 4/1998 | Nakamura | 364/478.01 |
| 5,740,059 | * 4/1998 | Hirata et al. | 364/478.01 |

(List continued on next page.)

FOREIGN PATENT DOCUMENTS

| | | |
|---|---|---|
| 0502412 | 9/1992 | (EP) . |
| 2056169 | 3/1981 | (GB) . |
| 0618153 | 3/1986 | (JP) . |
| 63-133532 | 6/1988 | (JP) . |
| 630369 | 4/1994 | (JP) . |
| 6314729 | 11/1994 | (JP) . |
| 6314730 | 11/1994 | (JP) . |

OTHER PUBLICATIONS

IBM Technical Disclosure Bulletin, vol. 27, No. 12, May 31, 1985, pp. 6997–6998 XP002017023 "Generic Work Station".

Primary Examiner—Christopher P. Ellis
Assistant Examiner—Michael E. Butler
(74) Attorney, Agent, or Firm—Antonelli, Terry, Stout & Kraus, LLP

(57) ABSTRACT

A vacuum processing apparatus is composed of a cassette block and a vacuum processing block. The cassette block has a cassette table for mounting a plurality of cassettes containing a sample and an atmospheric transfer means. The vacuum processing block has a plurality of processing chambers for performing vacuum processing on the sample and a vacuum transfer means for transferring the sample. Both of the plan views of the cassette block and the vacuum processing block are nearly rectangular, and the width of the cassette block is designed to be larger than the width of the vacuum processing block, and the overall plan view of the vacuum processing apparatus is formed in an L-shape or a T-shape.

7 Claims, 22 Drawing Sheets

U.S. PATENT DOCUMENTS

| | | | |
|---|---|---|---|
| 5,855,726 | * | 1/1999 | Saraoka et al. ........................ 156/345 |
| 5,900,105 | * | 5/1999 | Toshima ............................... 414/939 |
| 5,928,399 | * | 7/1999 | Yakou et al. .......................... 65/152 |
| 5,951,823 | * | 9/1999 | Caram et al. ......................... 162/352 |
| 6,069,096 | * | 5/2000 | Nishihata et al. .................... 438/905 |
| 6,110,008 | * | 8/2000 | Fujita et al. ............................. 451/8 |

* cited by examiner

VACUUM PROCESSING APPARATUS AND SEMICONDUCTOR MANUFACTURING LINE USING THE SAME

This is a divisional application of U.S. Ser. No. 08/677, 682, filed Jul. 8, 1996 now U.S. Pat. No. 5,855,726.

BACKGROUND OF THE INVENTION

The present invention relates to a vacuum processing apparatus; and more particularly, the invention relates to a vacuum processing apparatus which is suitable for performing treatment, such as etching, chemical vapor deposition (CVD), spattering, ashing, rinsing or the like, on a sample a semiconductor substrate, such as a Si substrate, and to a semiconductor manufacturing line for manufacturing semiconductor devices using the vacuum processing apparatus.

Basically, a vacuum processing apparatus is composed of a cassette block and a vacuum processing block. The cassette block has a front facing the bay path of the semiconductor manufacturing line and extending toward the longitudinal direction of the semiconductor manufacturing line, an alignment unit for aligning the orientation of a cassette for a sample or the orientation of a sample, and a robot operating under an atmospheric pressure environment. The vacuum block has a load lock chamber in the loading side, a load lock chamber in the unloading side, a processing chamber, a post treating chamber, a vacuum pump and a robot operating under a vacuum environment.

In the vacuum processing apparatus, a sample extracted from the cassette in the cassette block is transferred to the load lock chamber of the vacuum processing block by the atmospheric transfer robot. The sample is further transferred to the processing chamber from the load lock chamber by the atmospheric transfer robot and is set on an electrode structure body to be subjected to processing, such as plasma treatment. Then, the sample is transferred to the post treating chamber to be processed, if necessary. The sample having been processed is transferred to the cassette in the cassette block by the vacuum transfer robot and the atmospheric transfer robot.

Vacuum processing apparatuses for performing plasma etching on a sample are disclosed, for example, in Japanese Patent Publication No. 61-8153, Japanese Patent Application Laid-Open No. 63-133532, Japanese Patent Publication No. 6-30369, Japanese Patent Application Laid-Open No. 6-314729, Japanese Patent Application Laid-Open No. 6-314730, and U.S. Pat. No. 5,314, 509.

In the referenced above conventional vacuum processing apparatuses, the processing chambers and the load lock chambers are concentrically arranged or arranged in rectangular shape. For example, in the apparatus disclosed in U.S. Pat. No. 5,314,509, a vacuum transfer robot is arranged near the center of the vacuum processing block with three processing chambers being concentrically arranged around the vacuum transfer robot, and a load lock chamber in the loading side and a load lock chamber in the unload side are provided between the vacuum transfer robot and the cassette block. In these apparatuses, there is a problem in that the required installation area of the whole apparatus is large since the rotating angles of the transfer arms of the atmospheric transfer robot and the vacuum transfer robot are large.

On the other hand, the processing chamber in the vacuum processing block and the vacuum pump and other various kinds of piping components of the vacuum processing apparatus require maintenance, such as scheduled and unscheduled inspection or repairing. Therefore, in general, there are provided doors around the vacuum processing block so that inspection and repairing of the load lock chamber, the un-load lock chamber, the processing chamber, the vacuum transfer robot and the various kinds of piping components can be performed by opening the doors.

In the conventional vacuum processing apparatus, there is a problem in that the installation area is large even though the sample to be handled has a diameter d smaller than 8 inches (nearly 200 mm) and the outer size of the cassette $C_w$ is nearly 250 mm. Further, in the case of handling a large diameter sample having a diameter d above 12 inches (nearly 300 mm), the size of the cassette $C_w$ becomes nearly 350 mm. Accordingly, the width of the cassette block containing a plurality of cassettes becomes large. If the width of the vacuum processing block is determined based on the width of the cassette block, the whole vacuum processing apparatus requires a large installation area. Considering a cassette block containing four cassettes as an example, the width of the cassette block cannot help but increase at least by nearly 40 cm when the diameter d of a sample increases from 8 inches to 12 inches.

On the other hand, in a general semiconductor manufacturing line, in order to process a large amount of samples and employ various kinds of processes, a plurality of vacuum processing apparatuses performing the same processing are gathered in a bay, and transmission of samples between bays is performed automatically or manually. Since such a semiconductor manufacturing line requires a high cleanness, the whole semiconductor manufacturing line is installed in a large clean room. An increase in the size of a vacuum processing apparatus due to an increase in diameter of a sample to be processed results in an increase in the required installation area of the clean room, which further increases the construction cost of the clean room which by its nature already has a high construction cost. If vacuum processing apparatuses requiring a larger installation area are installed in a clean room having the same area, a reduction in the total number of the vacuum processing apparatuses or a decrease in the spacing between the vacuum processing apparatuses becomes inevitable. A reduction in the total number of the vacuum processing apparatuses in the clean room having the same area decreases the productivity of the semiconductor manufacturing line and increases the manufacturing cost of the semiconductor devices as an inevitable consequence. On the other hand, a decrease in the spacing between the vacuum processing apparatuses decreases the maintainability of the vacuum processing apparatus due to lack of maintenance space for inspection and repair.

SUMMARY OF THE INVENTION

An object of the present invention is to provide a vacuum processing apparatus which is capable of coping with larger diameter samples while keeping the manufacturing cost to a minimum.

Another object of the present invention is to provide a vacuum processing apparatus which is capable of coping with larger diameter samples and at the same time having a better maintainability.

A further object of the present invention is to provide a semiconductor manufacturing line which is capable of coping with larger diameter samples while keeping manufacturing cost to a minimum by keeping the necessary number of vacuum processing apparatuses, through more economical use of space and at the same time not decreasing the maintainability.

In order to attain the above objects, the present invention provide a vacuum processing apparatus composed of a cassette block and a vacuum processing block, and the cassette block has a cassette table for mounting a cassette containing a sample, and the vacuum processing block has a processing chamber for treating the sample and a vacuum transfer means for transferring the sample. In the vacuum processing apparatus, both of the plan views of the cassette block and the vacuum processing block are nearly rectangular and the relation $W_1-W_2 \geqq C_w$ is satisfied, where $W_1$ is the width of the cassette block, $W_2$ is the width of the vacuum processing block, and $C_w$ is the width of one cassette.

Another characteristic of the present invention is that the width of the cassette block is designed to be larger than the width of the vacuum processing block, and the plan view of the vacuum processing apparatus is formed in an L-shape or a T-shape.

A further characteristic of the present invention is that a semiconductor manufacturing line comprising a plurality of bay areas having a plurality of vacuum processing apparatuses composed of a cassette block and a vacuum processing block are arranged in the order of the manufacturing process, and the cassette block has a cassette table for mounting a cassette containing a sample, and the vacuum processing block has a process chamber for performing vacuum processing on to the sample and a vacuum transfer means for transferring the sample. In the semiconductor manufacturing line, at least one of the vacuum processing apparatuses is designed so that the cassette block is capable of containing a sample having a diameter not less than 300 mm, and the relation $W_1-W_2 \geqq C_w$ is satisfied, where $W_1$ is the width of the cassette block, $W_2$ is the width of the vacuum processing block, and $C_w$ is the width of one cassette.

A still further characteristic of the present invention is that a method of constructing a semiconductor manufacturing line which comprises a plurality of vacuum processing apparatuses composed of a cassette block capable of containing a sample having a diameter not less than 300 mm, and a vacuum processing block for performing vacuum processing on said sample. In the method of constructing a semiconductor manufacturing line, at least one of the vacuum processing apparatuses is designed so that the width of the cassette block is larger than the width of the vacuum processing block; the plane view of the vacuum processing apparatus is formed in an L-shape or a T-shape; and a maintenance space is provided between the L-shaped or the T-shaped vacuum processing apparatuses and the adjacent vacuum processing apparatus.

According to the present invention, the view shapes of the cassette block and the vacuum processing block are rectangular, and the cassette block and the vacuum processing block are designed so that the relation $W_1>W_2$ is satisfied, where $W_1$ is the width of the cassette block and $W_2$ is the width of the vacuum processing block. Thereby, the plan view of the whole of the vacuum processing apparatus becomes L-shaped or T-shaped. In a case of arranging many such vacuum processing apparatuses, a sufficient space can be provided between the vacuum processing blocks positioned adjacent to each other, even if the interval between the vacuum processing blocks is made small. For example, when $W_1$ is 1.5 m and $W_2$ is 0.8 m, a maintenance space of 0.7 m can be provided between the vacuum processing apparatuses located adjacent to each other.

Therefore, in spite of a larger diameter sample, the number of vacuum processing apparatuses installed in a clean room, having the same area as a conventional clean room, does not need to be reduced. Accordingly, the productivity of the semiconductor manufacturing line does not decrease. Thus, it is possible to provide a vacuum processing apparatus which can cope with a larger diameter sample and, at the same time, can suppress any increase in the manufacturing cost, and has better maintainability.

Further, by employing the vacuum processing apparatus according to the present invention in a semiconductor manufacturing line, it is possible to provide a semiconductor manufacturing line which can cope with a larger diameter sample while keeping manufacturing cost to a minimum by keeping the necessary number of vacuum processing apparatuses, through more economical use of space and, at the same time, without decreasing the maintainability.

DETAILED DESCRIPTION OF THE PREFERRED EMBODIMENTS

Figure 1:
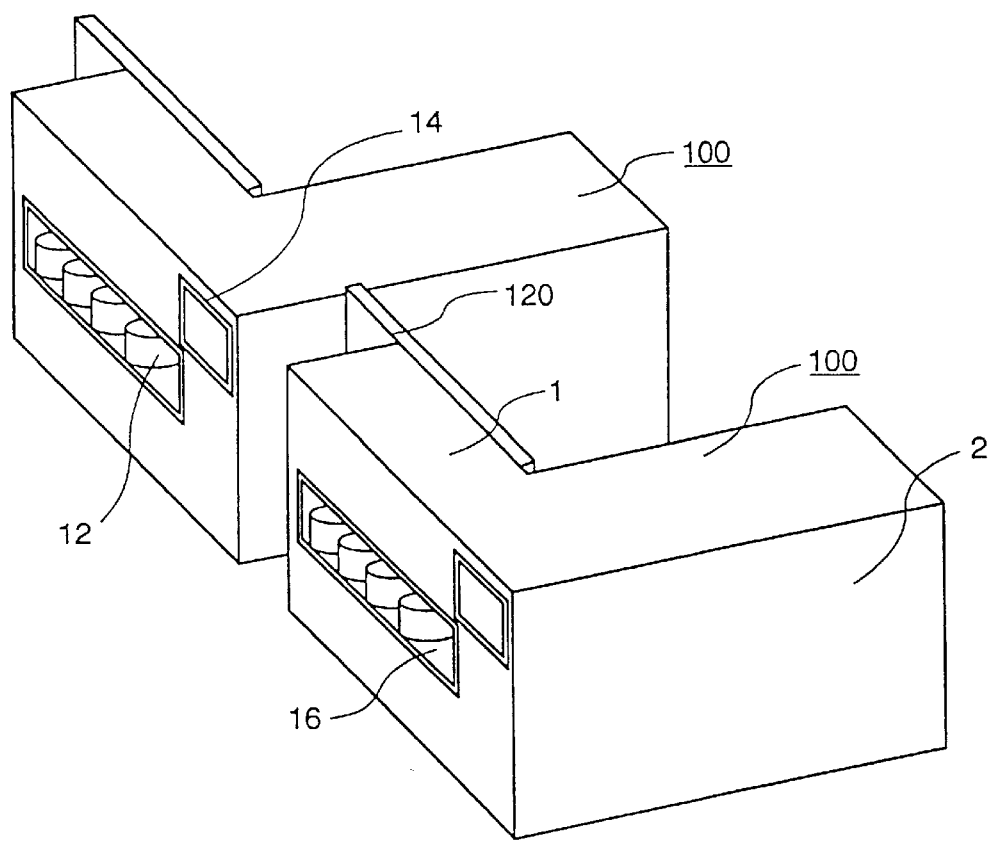
FIG. 1 is a perspective view showing an embodiment of a vacuum processing apparatus in accordance with the present invention.

An embodiment of a vacuum processing apparatus in accordance with the present invention will be described in detail below, referring to FIG. 1 to FIG. 4. As shown in FIG. 1, each of a pair of vacuum processing apparatuses 100 is composed of a rectangular block shaped cassette block 1 and a rectangular block shaped vacuum processing block 2. Each of the plan shapes of the cassette block 1 and the vacuum processing block 2 is rectangular, and the whole plan shape formed by both is L-shaped. The cassette block 1 faces a bay path of a semiconductor manufacturing line and extends in the lateral direction of the bay path, and in the front side of the cassette block there are a cassette table 16 for receiving and transferring a cassette 12 containing a sample from and to the bay path and an operation panel 14. The vacuum processing block 2 installed in the back side of the cassette block 1 extends in the direction perpendicular to the cassette block 1 and contains various kinds of devices for performing vacuum processing, as well as a transfer device.

Figure 2:
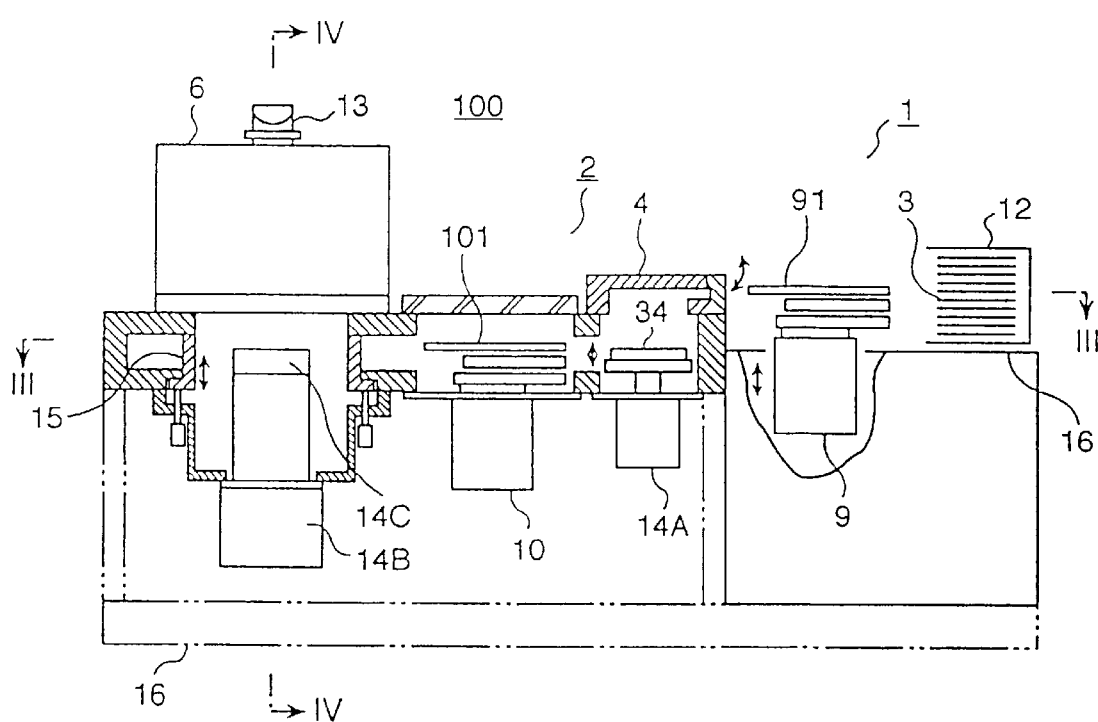
FIG. 2 is a vertical cross-sectional view showing the main portion of the apparatus of FIG. 1.
Figure 3:
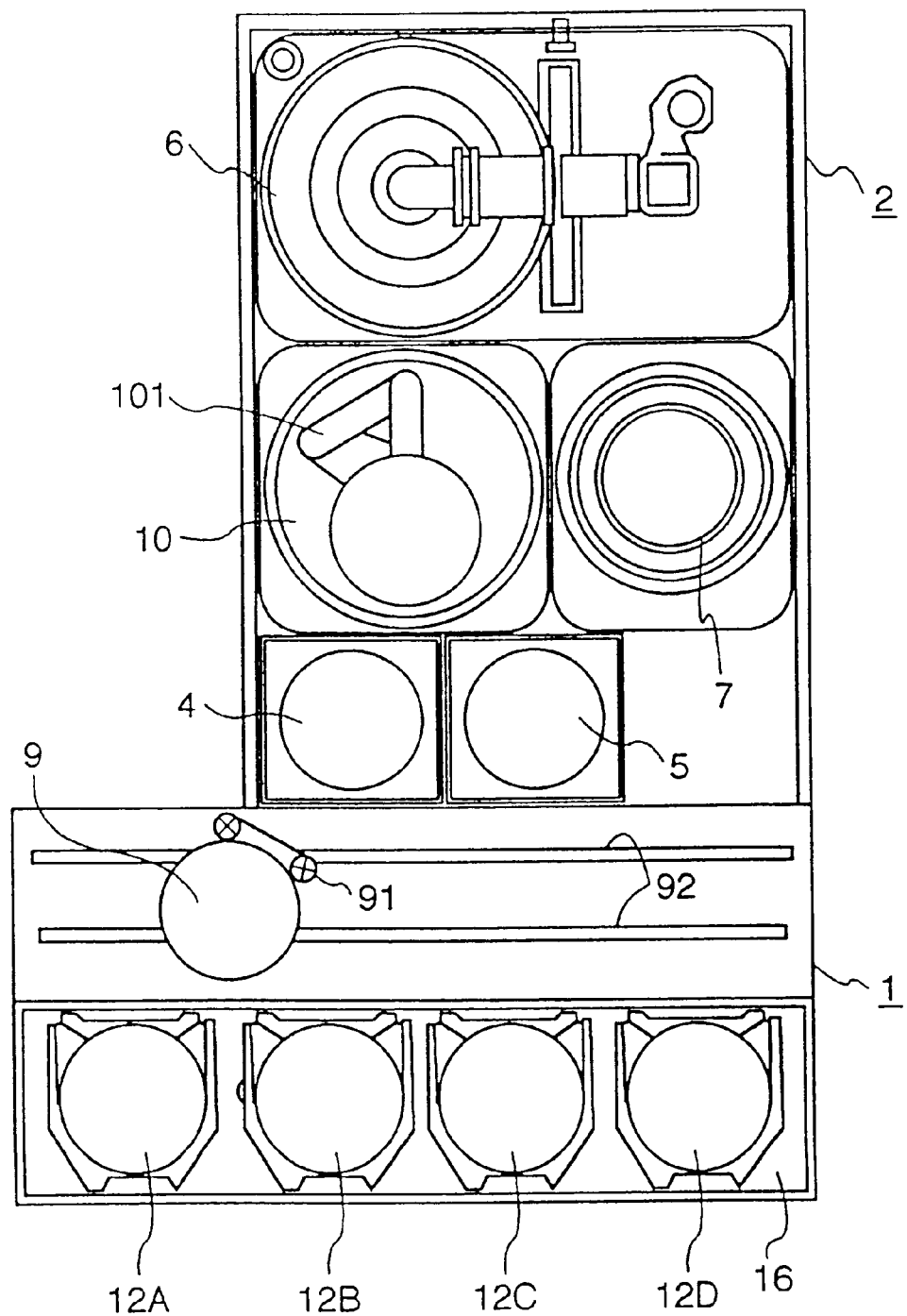
FIG. 3 is a section of the vacuum processing apparatus being taken on the plane of the line III—III of FIG. 2.
Figure 4:
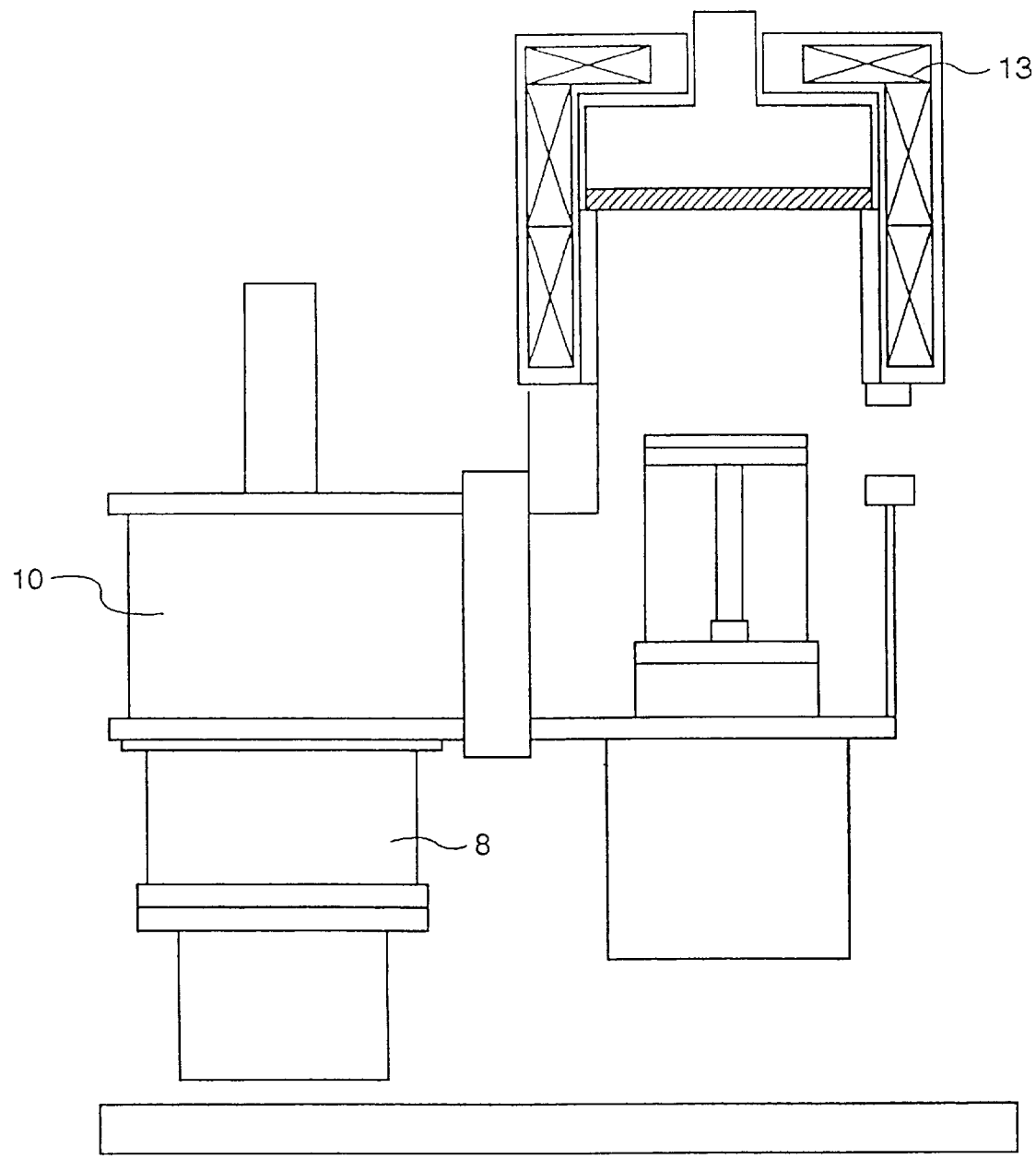
FIG. 4 is a cross-sectional view showing the apparatus being taken on the plane of the line IV—IV of FIG. 2.

As shown in FIG. 2 to FIG. 4, in the cassette block 1 there are provided an atmospheric robot 9 for transferring a sample and cassettes 12 for holding a sample. The sample cassettes 12 are product sample cassettes 12A, 12B, 12C and a dummy sample cassette 12D. An orientation adjuster for the sample may be provided near the cassettes 12, if necessary. A cassette 12 contains only product samples or product and dummy samples. Samples for checking for a foreign substance and/or for cleaning are contained in the uppermost stage and/or the lowermost stage of the cassette.

In the vacuum processing block 2, there are provided a load side load lock chamber 4, an unload side load lock chamber 5, a processing chamber 6, a post treating chamber 7, a vacuum pump 8 and a vacuum transfer robot 10. The reference character 13 denotes a discharging means for etching, and the reference character 14 denotes a discharging means for post treatment (ashing).

The atmospheric transfer robot 9 is movably installed on a rail 92 placed parallel to the cassette table 16 inside the cassette block 1 and operates to transfer a sample 3 from a cassette 12 to the load lock chamber 4 on the load side from the load lock chamber 5 on the unload side. The vacuum transfer robot 10 transfers the sample 3 from the load lock 4 on the load side to the processing chamber 6 and also transfers the sample 3 to and from the processing chamber 6, the load lock chamber 5 on the unload side and the post treating chamber 7. The present invention is based on handling of a larger diameter sample having a diameter d above 12 inches (nearly 300 mm). When the diameter of the sample is 12 inches, the outer size $C_w$ of the cassette is nearly 350 mm to 360 mm.

The processing chamber 6 processes the samples 3 one-by-one, and is, for example, a chamber for performing plasma etching disposed in the upper left of the vacuum processing block 2. The load lock chamber 4 on the load side and the load lock chamber 5 on the unload side are located on the opposite side of the vacuum transfer robot 10 from the processing chamber 6, that is, they both are placed in the lower position of the vacuum processing block 2. The post treating chamber 7 is a chamber for post treating processed samples 3 one-by-one, and located in the middle position of the vacuum processing block 2 facing the load lock chamber 5 on the unload side.

The atmospheric transfer robot 9 has an extensible arm 91 which is so designed that the locus of the extensible arm extending and contracting while the robot is moving on the rail 92 includes a locus containing a cassette 12 in the load lock chamber 4 on the load side and the load lock chamber 5 on the unload side. The vacuum transfer robot 10 has an extensible arm 101 which is so designed that the rotating locus of the extensible arm includes a locus containing the load lock chamber 4 on the load side and the processing chamber 6 in the vacuum processing block 2. Therefore, the extensible arm 101 of the vacuum transfer robot 10 is so installed that the rotating locus contains the processing chamber 6, the load lock chamber 5 on the unload side and the post treating chamber 7. The installed position of the atmospheric transfer robot 9 may be in the right side position on the cassette block 1.

A wafer search mechanism is provided around each of the cassettes 12 to recognize the samples in each of the cassettes when a cassette 12 is set. In the load lock chambers 4, 5 and the processing chamber 6 and the post treating chamber 7, there are provided sample lifting mechanisms 14A, 14B, respectively, so that a sample 3 can be transferred to the extensible arm 91 or 101 in each of the robots. Further, of the processing chamber 6, there are provided an electrode of an etching discharge means 13 and a sample mounting table 14C. Inside the etching discharge means 13, there is provided sample lifting mechanism 14B. The reference character 15 is a ring-shaped gate valve.

An operation of for processing a sample inside the processing chamber 100 will be described below, taking plasma etching as an example. Initially, the atmospheric transfer robot 9 in the cassette block 1 is moved on the rail 92 to approach, for example, the cassette 12A on the load side, and a fork (not shown) is inserted under a sample 3 inside the cassette by extending the extensible arm 91 toward the cassette 12A to mount the sample 3 on the fork. After that, the arm 91 of the atmospheric transfer robot 9 is moved to the load lock chamber 4 while the cover of the load lock chamber 4 is kept open to transfer the sample 3 therein. A this time, the atmospheric transfer robot 9 is moved on the rail 92 in such a manner that the stroke of the extensible arm 91 may easily reach the load lock chamber 4, if necessary.

Then, the sample lifting mechanism 14A is operated to support the sample 3 on a support member thereof in the load lock chamber 4. Further, after evacuating the load lock chamber 4 to a vacuum, the support member is lowered by operating the sample lifting mechanism 14A again to transfer the sample to the arm 101 of the vacuum transfer robot 10 and transfer the sample along the transfer path into the processing chamber 6 in a vacuum environment. By the reverse operation, the sample is transferred to a cassette position on the unload side in the cassette block 1.

In a case requiring post treatment, the sample is transferred to the post treating chamber 7 using the arm 101 of the vacuum transfer robot 10. In the post treating chamber 7, a sample having been subject to etching processing is subject to plasma post treatment such as ashing.

In FIG. 3, the locus of the arm 101 of the vacuum transfer robot 10 is as follows, taking a case where samples 3 are in the load lock chamber 4, the processing chamber 6 and the post treating chamber 7 and no sample is in the load lock chamber 5 the arm 101 of the vacuum transfer robot 10 initially transfers the one sample 3 in the post treating chamber 7 to the load lock chamber 5 and then the sample 3 in the processing chamber 6 is transferred to the post treating chamber 7. Next, the sample 3 in the load lock chamber 4 is transferred to the vacuum chamber 6. After treatment, the sample 3 in the treating chamber 6 is transferred to the post treating chamber 7. The arm 101 repeats a trace of the same locus.

Since the vacuum transfer robot 10 is placed near the side of the vacuum processing block 2, a worker can inspect and repair the vacuum transfer robot with ease and accordingly maintenance can be easily performed.

Figure 5:
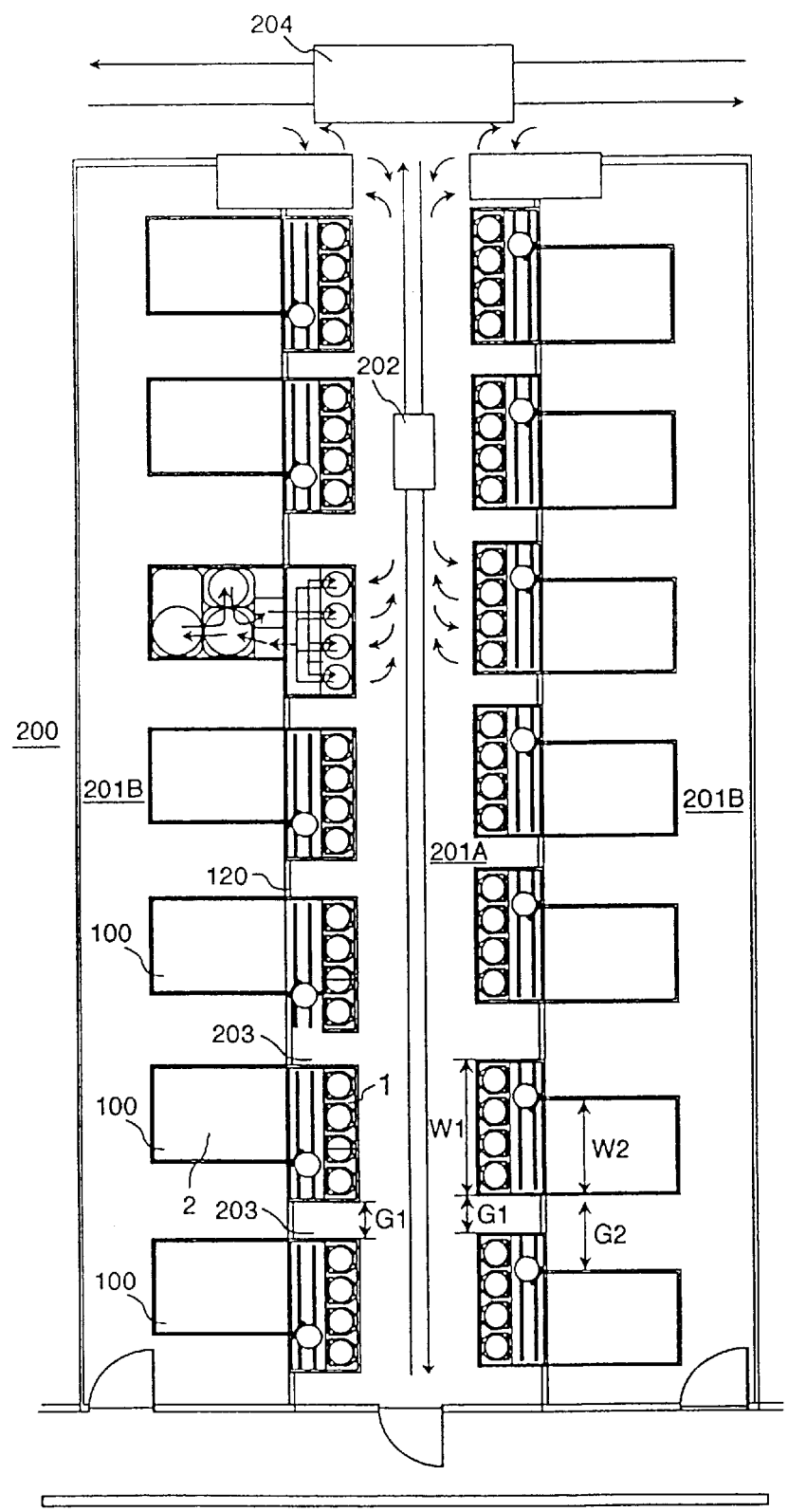
FIG. 5 is a plan view showing a bay area of a semiconductor manufacturing line having a vacuum processing apparatus in accordance with the present invention.

FIG. 5 is a plan view showing an embodiment of a bay area 200 of a semiconductor manufacturing line made up of a plurality of processing apparatuses 100 in accordance with the present invention. In the figure, many L-shaped vacuum processing apparatuses 100 are arranged in spaced relationship with a gap G1 within a maintenance space 203, and a partition 120 divides the room into a high clean level room 201A and low clean level rooms 201B. An automatic transfer machine 202 for supplying and transferring samples 3 is installed along the front surface of the cassette blocks 1 down the center of the high clean level room 201A. On the other hand, many vacuum processing blocks 2 are arranged in the low clean level room 201B, and the interval B2 between them represents a maintenance space to be described later.

Figure 6A:
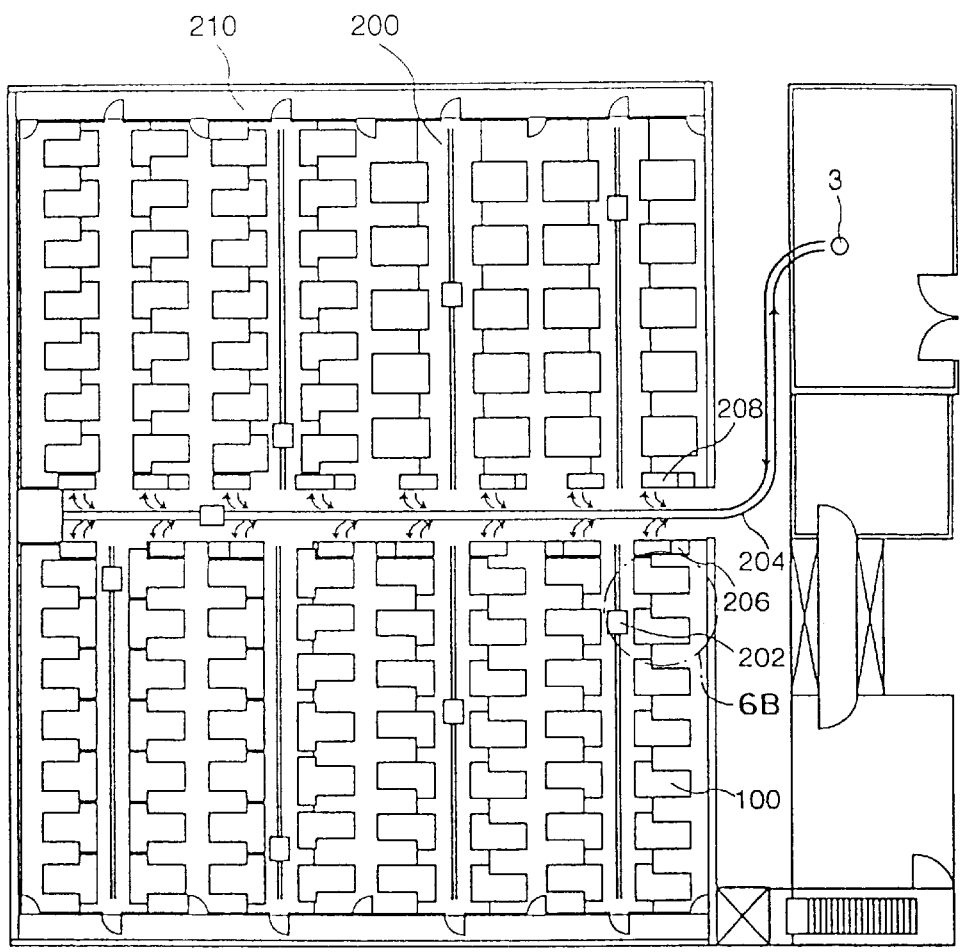
FIG. 6A is a top plan view showing a part of a sample flow in a semiconductor manufacturing line.
Figure 6B:
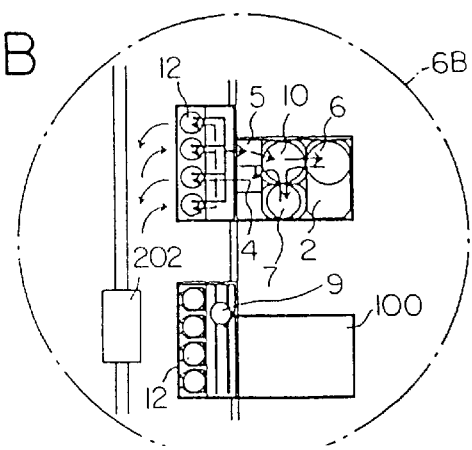
FIG. 6B is a detail view of the area 6B in FIG. 6A, in accordance with the present invention.

FIG. 6 FIG. 6A is the view showing a part of a flow of a sample 3 in an embodiment of a semiconductor manufacturing line in accordance with the present invention. At the entrance portion of each of the bay areas 200, there are provided an inspection apparatus 206 and a bay stoker 208. The back portion of each of the bay areas 200 communicates with a maintenance path 210, and there is provided an air shower 212 in the entrance of the maintenance path 210. The sample 3 supplied to the bay stoker 208 from the outside is successively transferred to an in-bay automatic transfer machine 202 in a certain bay area 200 corresponding to the manufacturing process using a line automatic transfer machine 204, as shown by arrows. Further, the sample 3 is transferred from the in-bay automatic transfer machine 202 to the cassette block of the vacuum processing apparatus 100. In the vacuum processing apparatus 100, as seen in FIG. 6B the sample 3 is transferred between the cassette block 1 and the vacuum processing block 2 by the atmospheric transfer robot 9 and the vacuum transfer robot 10. The sample 3 having been processed in the vacuum processing block 2 is transferred to the in-bay automatic transfer machine 202, and further is transferred to the line automatic transfer machine 204, and then is transferred to the next bay area 200.

In a semiconductor manufacturing line having an in-bay automatic transfer machine, the in-bay automatic transfer machine 202 supplies a new sample (unprocessed wafer) to the cassette block 1 in each of the vacuum processing apparatuses 100 from the bay stoker 208 provided in each of the bays 200, and recovers a cassette containing a processed sample from the cassette block 1.

In response to a demand signal output from each of the vacuum processing apparatuses 100, the in-bay automatic transfer machine 202 receives a cassette containing a new sample (unprocessed wafer) from the bay stoker 208 provided in each of the bays 200, and runs up to and stops at a cassette position where the cassette block 1 of the vacuum processing apparatus outputs the demand signal.

As a cassette handling robot installed in the in-bay automatic transfer machine 202, a robot having a three-axis control function including a rotating operation (θ-axis), vertical movement (Z-axis) and grip operation (φ-axis), or a four-axis control function including a rotating operation (θ-axis), vertical movement (Z-axis), grip operation (φ-axis) and back-and-forth movement (Y-axis) is used.

In a case where a processed cassette 12 has existed at a designated position in the cassette block 1, according to the required content output from each of the vacuum processing apparatuses 100, the cassette handling robot recovers the cassette 12 from the cassette block 1 and transfers it to an empty cassette store on the in-bay automatic transfer machine 202, and then supplies a new cassette 12 transferred from the bay stoker 208 to the empty position left by the recovering operation.

After completion of this operation, the in-bay automatic transfer machine transfers the recovered cassette 12 to the bay stoker 208, and stops its operation and stands by until the next demand signal is output from a vacuum processing apparatus 100 in the bay 200.

When demand signals are output from plural vacuum processing apparatuses 100, 100, . . . in the bay 200 within a short time, it depends on the system design whether the in-bay automatic transfer machine transfers samples according to the time sequence of the received signals, or in an order to achieve a higher transfer efficiency from the stand-by position of the in-bay automatic transfer machine 202 taking account of the relationship between the time difference in the demand signals and the positions of signal output apparatuses.

Cassette management is performed in such a manner that information on a received and sent cassette includes a number specified for each of cassettes and various kinds of the information used in managing the total manufacturing line, and this information is transmitted between the vacuum processing apparatus 100 and the in-bay automatic transfer machine 202 via, for example, an optical communication system.

The processing flow in the bay area 200 will be described below, in taking a sample in each cassette into consideration.

In the cassette block 1, three to four cassettes are placed side by side on a plane in the same level. In each of the cassettes, a given number of samples, in this case, semiconductor element substrates (wafers) having a diameter of 300 mm (12")are contained.

In the two to three cassettes 12 among the three to four cassettes, samples to be subject to certain vacuum processing in the vacuum processing portion (unprocessed wafers) are contained. In the remaining one cassette 12D, dummy wafers are contained.

The dummy wafer is used for checking for the number of foreign particles in the vacuum processing portion and/or for the cleaning process of the processing chamber composing the vacuum processing zone.

Here, the cassettes 12 containing samples before processing will be identified as 12A, 12B, 12C. In such a state, the state of samples of, the for example, the cassette 12A is checked by a wafer check means (not shown). In this case, the cassette 12A has a function to store samples in vertical direction one-by-one.

As the wafer check means used, there in an arrangement where a sensor is successively moved so as to the position of successive correspond to sample containing stages of the cassette 12A, and another arrangement where plural sensors are provided corresponding to respective sample containing stages of the cassette 12A. In the latter arrangement, there is no need to provide a means for moving a sensor to sample containing stages of the cassette 12A. On the other hand, it may be possible to fix the sensor for the wafer check means and move the cassette 12A instead.

Using the wafer check means, it is determined in which positions in the vertical direction of the cassette 12A the unprocessed samples are contained. For example, in a case where the wafer check means is the type in which a sensor is successively moved so as to correspond to the position of successive sample containing stages of the cassette 12A, the sensor detects a sample containing stage of the cassette 12A and the presence or absence of a unprocessed sample in the stage while the sensor is moving, for example, upward from the lower position of the cassette 12A, or downward from the upper position of the cassette 12A.

The check results are output from the wafer check means to be input to and stored in, for example, a host computer (not shown in the figure) of the semiconductor manufacturing line controller for managing all of the vacuum processing apparatuses. Otherwise, the check results may be input to and stored in a personal computer in a console box on the cassette mounting table or a host computer for controlling the apparatuses through the personal computer.

Then, in this embodiment, the atmospheric transfer robot 9 is started to operate. By operation of the atmospheric transfer robot 9, one of the unprocessed samples in the cassette 12A is extracted out of the cassette 12A.

The atmospheric transfer robot 9 has a scooping-up device for scooping up and holding the surface of a sample opposite (reverse) to the surface to be processed. The scooping-up devices used are a device which adheres to and holds the reverse side surface of the sample, a device having grooves or indented portions for holding the sample, and a device mechanically gripping the peripheral portion of the sample. Further, as for a device adhering to and holding the reverse side surface of the sample, there are devices operation with the use of vacuum sucking adhesion and electrostatic attraction.

In a case of using the device adhering and holding the reverse side surface of the sample having a diameter of 300 mm (12"), it is important to select the arrangement and the dimension of the adhering portion so as to minimize bending of the sample as much as possible. For example, the interval between the adhering portions is set to d/3 to d/2 taking the center of the sample as the center, where d is the diameter of the sample.

Depending on the amount of bending and the type of bending of the sample, displacement of the sample occurs when the sample is transferred between the scooping-up device and another transfer means, which sometimes causes an undesirable displacement of the orientation of the sample.

Further, in a case of using a device for adhering to and holding the reverse side surface of the sample, the adhering force is required to have a sufficient strength that the sample is not detached by the inertia force acting on the sample when the sample is being transferred, including the forces encountered during starting and stopping. If this condition is not satisfied, the sample may fall from the scooping-up device or a displacement of the orientation of the sample is likely to occur.

The scooping-up device is inserted in a position corresponding to the reverse surface of an unprocessed sample required to be extracted in the cassette 12A. In a state there the scooping-up device is inserted, the cassette 12A is lowered by a given amount or the scooping-up device is lifted by a given amount. By lowering the cassette 12A or lifting the scooping-up device, the unprocessed sample is transferred to the scooping-up device while the sample is kept in a scooped state. The scooping-up device then extracts the sample out of the cassette 12A. Thus, one of the unprocessed samples in the cassette 12A is extracted out of the cassette 12A.

As described above, for example, the host computer instructs and controls the atmospheric transfer robot 9 as to which unprocessed sample in the cassette 12A is to be extracted.

The information from which stage in the cassette 12A the unprocessed sample is extracted is successively stored in the host computer for every extraction of a sample.

The atmospheric transfer robot 9 having one unprocessed sample in the scooping-up device is moved to and stopped at a position where the sample can be loaded into the load lock chamber 4.

The load lock chamber 4 is isolated from a vacuum environment of the vacuum processing portion 2 and is in an atmospheric pressure state. The unprocessed sample held by the scooping-up device of the atmospheric transfer robot 9 is loaded into the load lock chamber 4 in such a state so as to be transferred to the load lock chamber 4 from the scooping-up device.

The atmospheric transfer robot 9 having transferred the unprocessed sample into the load lock chamber 4 is returned to a predetermined position for standing by until the next operation.

The operation described above is instructed and controlled by, for example, the host computer.

The information as to which stage in the cassette 12A an unprocessed sample loaded in the load lock chamber 4 is extracted from is successively stored in the host computer for every extraction of a sample.

The load lock chamber 4 having received an unprocessed sample is isolated from atmosphere and evacuated to vacuum. Then, the isolation from the processing chamber is released and the load lock chamber 4 is communicated with the processing chamber so as to be capable of transferring the unprocessed sample. Then, a predetermined vacuum processing is performed in the vacuum processing zone.

The sample having been subjected to vacuum processing (sample after processed) is transferred from the vacuum processing zone to the unload lock chamber 5 by a vacuum transfer robot so as to be loaded into the unload lock chamber 5.

The vacuum transfer robot has a scooping-up device similar to that in the atmospheric transfer robot 9. As the scooping-up device, scooping devices similar to those of the atmospheric transfer robot 9 may be used, except for the device having a function of vacuum adhesion.

After loading the processed sample, the unload lock chamber 5 is isolated from the vacuum processing portion 2 and the pressure inside the unload lock chamber 5 is adjusted to atmospheric pressure.

The unload lock chamber 5 in which the inner pressure becomes atmospheric pressure is opened to atmosphere. Under such a state, the scooping-up device of the atmospheric transfer robot 9 is inserted into the unload lock-chamber 5, and the processed sample is transferred to the scooping-up device.

The scooping-up device having received the processed sample transfers the sample out of the unload lock chamber 5. After that, the unload lock chamber 5 is isolated from atmosphere and evacuated to a vacuum so as to be prepared for loading of the next processed sample.

On the other hand, the atmospheric transfer robot 9 having the processed sample in the scooping-up device is moved to and stopped at a position where the processed sample can be returned to the cassette 12A.

Then, the scooping-up device having the processed sample is inserted into the cassette 12A. The host computer controls the inserting position so that the processed sample is returned to the position where the processed sample had been originally located.

After inserting the scooping-up device having the processed sample, the cassette 12A is lifted or the scooping-up device is lowered.

By doing so, the processed sample is returned to and contained in the position where the processed sample had been originally located.

Such an operation is similarly performed for the remaining unprocessed samples in the cassette 12A and also to the unprocessed samples in the cassettes 12B, 12C.

That is, an unprocessed sample successively extracted from each of the cassettes one by one is, for example, numbered, The host computer, for example, stores information indicating that an unprocessed sample extracted from which stage in which cassette has what number.

Based on the information, movement of a sample, extraction of the sample from a cassette, vacuum processing of the sample and returning the sample to the cassette after vacuum processing, is managed and controlled.

In other words, the movement of a sample from the time it is extracted to the time it is returned to the original cassette, is performed according to the following steps in the following order.

(1) checking the sample position in a cassette.
(2) extracting a sample in the cassette using an atmospheric transfer robot.
(3) loading the sample into a load lock chamber using an atmospheric transfer robot.
(4) transferring the sample from load lock chamber to a vacuum processing zone using a vacuum transfer robot.
(5) performing vacuum processing in the vacuum processing zone.
(6) transferring the sample from the vacuum processing zone to an unload lock chamber using the vacuum transfer robot.
(7) unloading the sample from the unload lock chamber using the atmospheric transfer robot.
(8) returning the sample into the original position in the cassette using the atmospheric transfer robot.

In every movement of the sample from steps (1) to (8) as described above, the host computer successively updates the information on what designated number sample each of the stations has. The updating processing is performed for every one of the samples. By doing so, each of the samples is known, that is, it is managed what designated number sample exists in which station.

For example, the successive updating state process by the host computer may be successively displayed on a vacuum processing system control CRT screen. In this case, each of the stations and what designated number sample exists at present at each station are displayed, so this information is easily recognized by an operator.

In a case where orientation adjustment of an unprocessed sample is performed, this step is performed between the above steps (2) and (3).

Such management and control for movement of samples may be performed in a case where the vacuum processing portion 2 has a plurality of vacuum processing zones.

Assuming that the vacuum processing portion 2 has, for example, two vacuum processing zones. In this case, the sample is processed in series or processed in parallel depending on the processing information. Here, series processing refers to a sample being vacuum-processed in one vacuum processing zone and the processed sample being successively vacuum-processed in the remaining vacuum processing zone. On the other hand parallel processing refers to a sample is vacuum-processed in one vacuum processing zone and another sample being vacuum-processed in the remaining vacuum processing zone.

In a case of series processing, a sample numbered by the host computer is processed according to a determined order and the processed sample is returned to the original position in the cassette.

In a case of parallel processing, since the host computer manages and controls in what vacuum processing zone and how a numbered sample is processed, the processed sample is returned to the original position in the cassette.

In a case of parallel processing, the host computer may manage and control which vacuum processing zone is used depending on which stage in the cassette the sample is extracted from and what designated number the sample has.

In a case where series processing and parallel processing are mixed, since the host computer manages and controls in what vacuum processing zone and how a numbered sample is processed, the processed sample is returned to the original position in the cassette.

Examples of the plural vacuum processing zones are a combination of zones having the same plasma generating method, a combination of different plasma etching zones, a combination of a plasma etching zone and a post-processing zone such as ashing, a combination of an etching zone and a film forming zone and so on.

The dummy sample in a cassette is handled in the same manner as for an unprocessed sample except for performing vacuum processing, which is performed on the unprocessed sample.

A detecting means for detecting presence or absence of a sample is provided in each cassette, in the scooping-up device of the atmospheric transfer robot, in the orientation adjusting station, in the station in the load lock chamber, in the scooping-up device of the vacuum transfer robot, in the station in the vacuum processing zone, and in the station in the unload lock chamber.

A contact type or a non-contact type sensor is properly selected to be used as the sample detecting means.

The cassette, the scooping-up device and each of the stations become checking points for the movement of the sample.

In such a construction, for example, when the presence of a sample is detected in the scooping-up device of the vacuum transfer robot 10 and the presence of a sample is not detected in the station in the vacuum processing zone, this means that a problem has occurred in the sample transfer machine between the scooping-up device of the vacuum transfer robot and the station in the vacuum processing zone due to some cause, and so recovering from the trouble can be properly and speedily preformed. Therefore, it is possible to prevent the throughput of the whole system from being degraded.

In a construction where the sample detecting means is not provided in each of the scooping-up devices of the transfer robots 9, for example, when the presence of a sample is detected in the station in the load lock chamber and the presence of a sample is not detected in the station in the vacuum processing zone, this means that a problem has occurred in the sample transfer machine between the station in the load lock chamber and the scooping-up device of the vacuum transfer robot, or in the vacuum transfer robot, or in the sample transfer machine between the scooping-up device of the vacuum transfer robot and the station in the vacuum processing zone due to some cause, and so recovering from the trouble can be properly and speedily preformed. Therefore, it is possible to prevent the through-put of the whole system from being degraded.

Such an embodiment has the following usefulness.

(1) Since the stage in the cassette in which an unprocessed sample is contained is checked and movement of the checked unprocessed sample is successively monitored and controlled by numbering the unprocessed sample, the processed sample can be certainly returned to the original position of the cassette.

(2) Since the stage in the cassette in which an unprocessed sample is contained is checked and movement of the checked unprocessed sample is successively monitored and controlled by numbering the unprocessed sample even in a case of series processing, parallel processing or a combination thereof, the processed sample can be certainly returned to the original position of the cassette.

(3) Since the stage in the cassette in which an unprocessed sample is contained is checked and movement of the checked unprocessed sample is successively monitored and controlled by numbering the unprocessed sample, the processing state of the sample processed in the vacuum processing portion one by one can be properly checked and managed in detail.

For example, in a case where a defect occurs in the processing of a sample, since a processing state for each of the samples including the processing condition is managed, the processing state can be identified by the information as to which stage in what cassette the defective sample is contained in. Therefore, the cause of the defect can be known in a short time and accordingly the time required for countermeasure can be saved by the time shortened in identification of the processing state.

Although the description in the above embodiment is based on a sample having a diameter of 300 mm (12"), the usefulness of the invention is not limited to the diameter of the sample.

The maintenance of the equipment will be described below.

As for maintenance of the vacuum processing apparatus 100 in accordance with the present invention, most of the maintenance of the cassette block 1 can be performed from the front side of the cassette block since the cassette block 1 faces the line of the in-bay automatic transfer machine 202.

On the other hand, for the maintenance of vacuum processing block 2, an operator is required to enter the area of the vacuum processing block 2 from the back side of each bay area through the maintenance path 203 or through the maintenance path 210.

Figure 7:
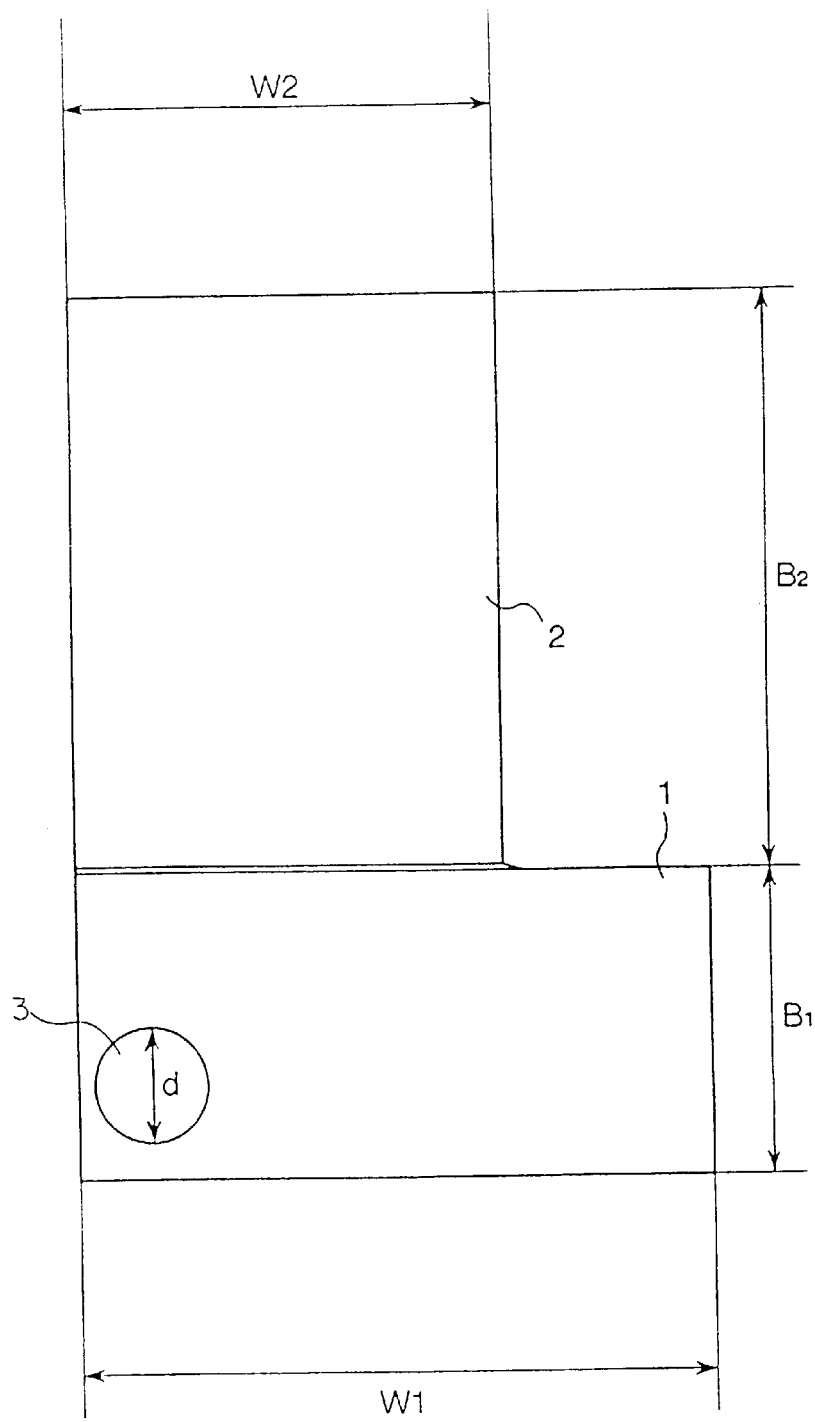
FIG. 7 is a diagrammatic view showing the relationship between the size of a vacuum processing block and the size of a cassette block.
Figure 8:
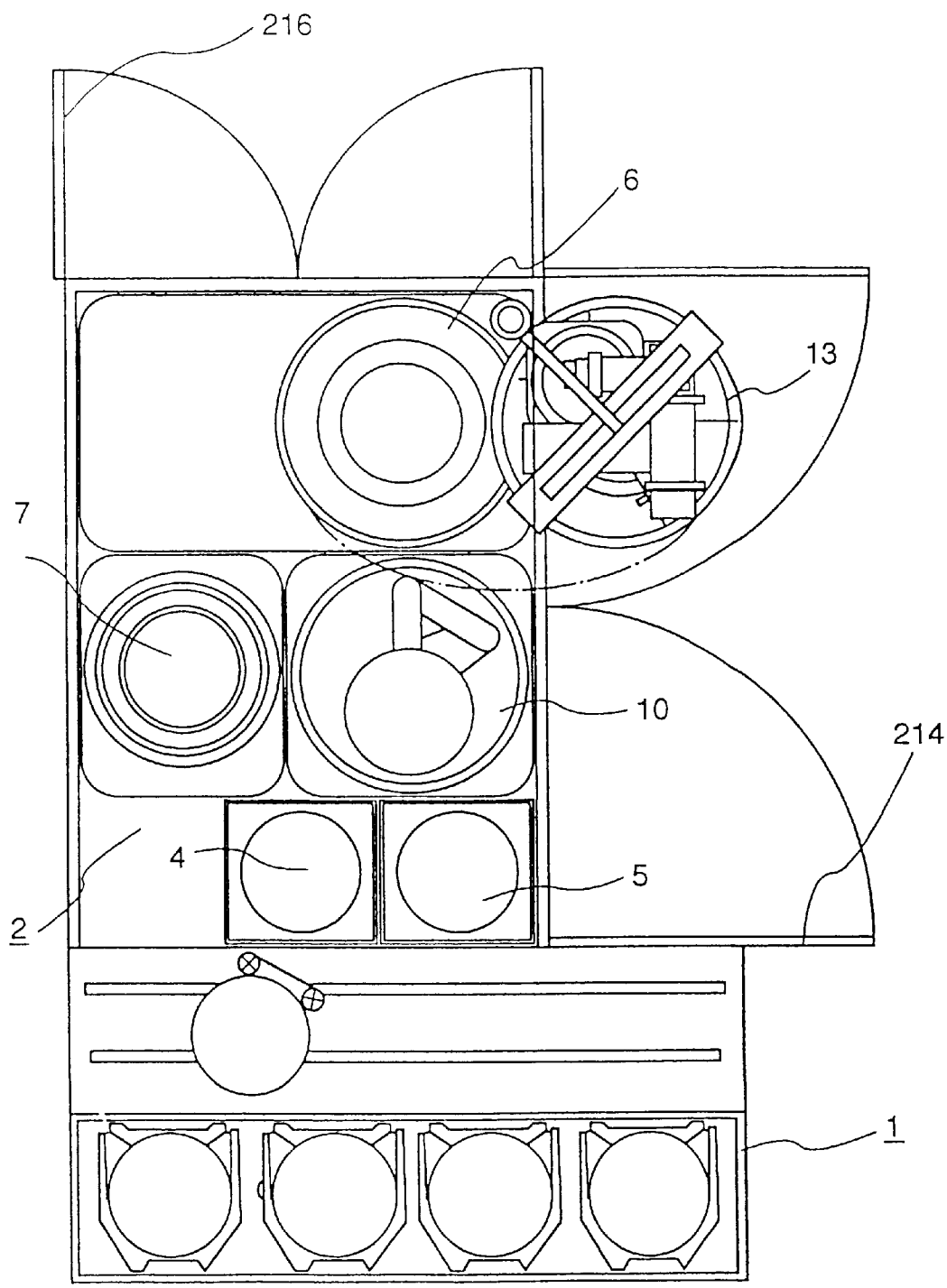
FIG. 8 is a top plan view for explaining how maintenance of a vacuum block of a vacuum processing apparatus is carried out in accordance with the present invention.

FIG. 7 is a view showing the relationship between the size of the vacuum processing block 2 and the size of the cassette block 1. When the longer side (width) of the vacuum processing block 2 is designated as W1 and the shorter side is designated as B1, and the longer side (width) of the cassette block 1 is designated as written by W2 and the shorter side is designated as B2, the relations W1>B1, W2>B2 are satisfied. It is preferable for the relation W1−W2≈d to be satisfied, where d is the diameter of the sample.

When the gap between the cassette blocks of the vacuum processing apparatuses adjacent to each other is designated as G1 and the gap between the vacuum processing blocks adjacent to each other is designated as G2 (referring to FIG. 5), it is assumed that the relation G1<G2 is satisfied. The maintenance space between the vacuum processing apparatuses 100 adjacent to each other can be expressed by (W1+G1)−W2=MS. MS is a dimension required for maintenance work of an operator. In this case, it is preferable for the relation (W1+G1)−W2≈d to be satisfied. Although the maintenance space 203 is an entrance for the operator, there are some cases where the space is not provided depending on the layout of the bay area 200. Even in such a case, an installation clearance G1 between the vacuum processing apparatuses adjacent to each other is required at minimum, but the installation clearance practically becomes a value near zero. In this case, W1−W2=MS becomes the maintenance space.

The side face of the vacuum processing block 2 of the vacuum processing apparatus 100 in accordance with the present invention is the opening type door structure. That is, two pairs of hinged doors 214, 216 are provided in the side face and the back face of the vacuum processing block 2.

In order to perform maintenance, it is required that (1) there are spaces from which an operator can check the devices and the pipes from back and front sides, (2) there are spaces to which the various kinds of devices and pipes, for example, the main chamber can be drawn, and (3) there are spaces in which the doors can be opened. Therefore, the maintenance space MS is preferably 90 to 120 cm.

According to the vacuum processing apparatus 100 in accordance with the present invention, an operator can easily access to the side face and the back face of the vacuum processing block 2. Further, by opening the doors 214, the load lock chamber 5, the post treating chamber 7, the vacuum transfer robot 10 and the various kinds of pipes and devices can be inspected and repaired. Furthermore, by opening the doors 216, the processing chamber 6 and the vacuum pump and the various kinds of pipes and devices can be inspected and repaired.

Since there is the maintenance space MS between the vacuum processing blocks 2, there is no obstacle to the operator opening the doors 214 in the side to perform maintenance work. Further, there is provided enough space in the back face side of the vacuum processing block 2 to open the doors 216 and perform maintenance work.

Figure 9:
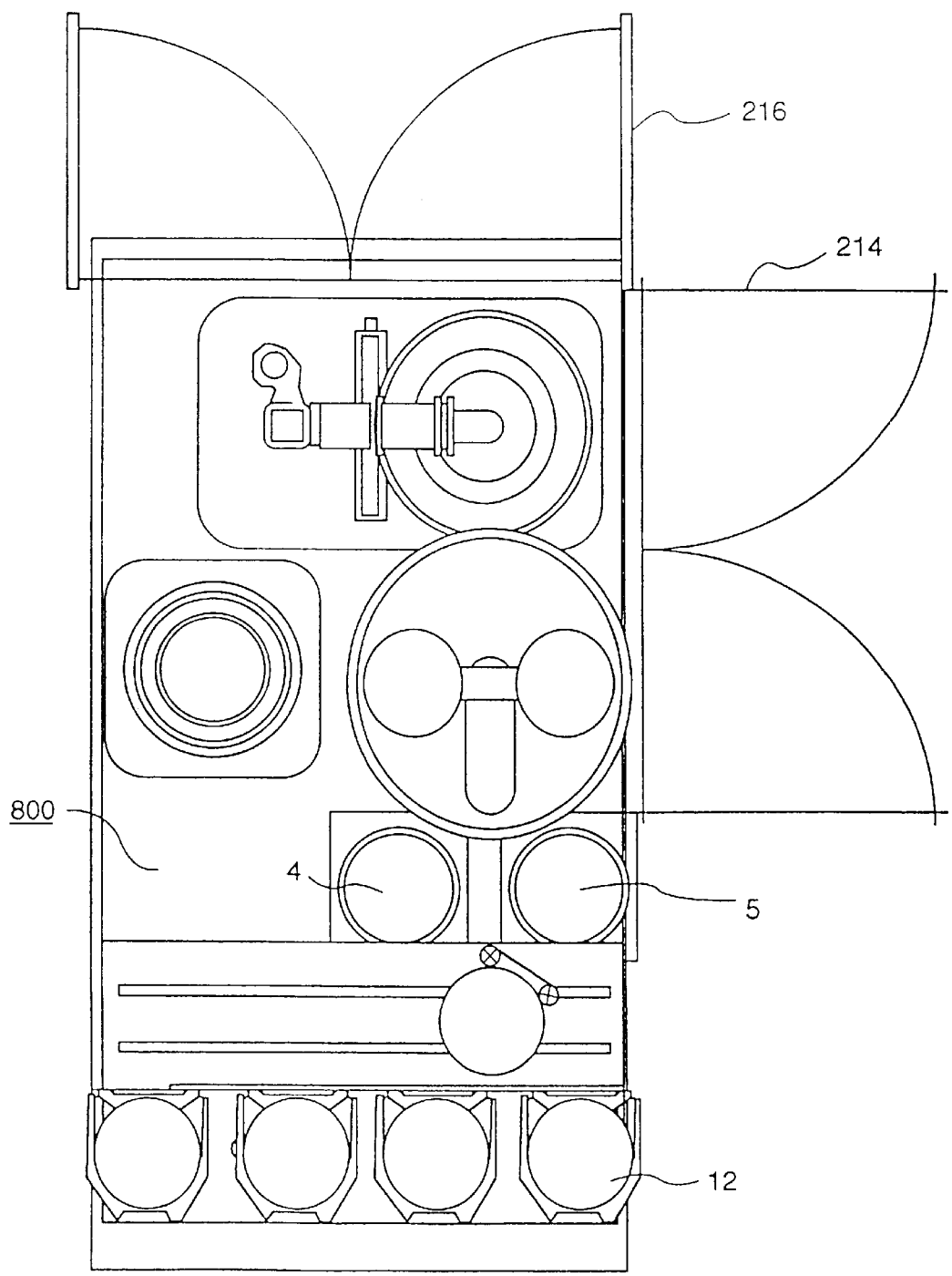
FIG. 9 is a plan view showing the construction of an example of a plan conventional vacuum processing apparatus.

The plan shape of the vacuum processing apparatus 100 is L-shaped, as described before. On the other hand, in the conventional vacuum processing apparatus 800, the vacuum processing block and the cassette block are generally constructed together to form a rectangular shape on the whole, as shown in FIG. 9. The rectangular shape is selected based on the shape of various kinds of elements installed in the vacuum processing apparatus and the mutual operational relationship among the various kinds of elements. In the general conventional vacuum processing apparatus, when the gap between the cassette blocks adjacent to each other is designated as G1 and the gap between the vacuum processing blocks adjacent to each other is designated as 2, there is the relation G1≧G2.

Since the conventional vacuum processing apparatus 800 deals with samples having a diameter d not larger than 8 inches, such a construction described above can be used. However, in an apparatus dealing with a sample having a diameter d as large as 12 inches, the outer dimension of the cassette 12 becomes larger and consequently the width W1 of cassettes block containing a plurality of the cassette 12 becomes larger. Since the width (W2≈W1) of the vacuum processing block is determined corresponding to the width W1, the whole of the vacuum processing apparatus 800 requires a larger space. Further, as the widths W1, W2 of the cassette block and the vacuum processing block become larger, the doors 214, 216 must be made larger and a large maintenance space is required in order to provide a space for the doors 214, 216 to be opened. For example, if a 12-inch sample is dealt with in the conventional apparatus, W1=W2=150 cm, G1=G2=90 cm and the maintenance space between the vacuum processing apparatuses 100 adjacent to each other becomes MS=90 cm. This results in an increase in the effective occupying area of the vacuum processing apparatus 800 in each of the bay areas. This is not preferable.

Figure 10:
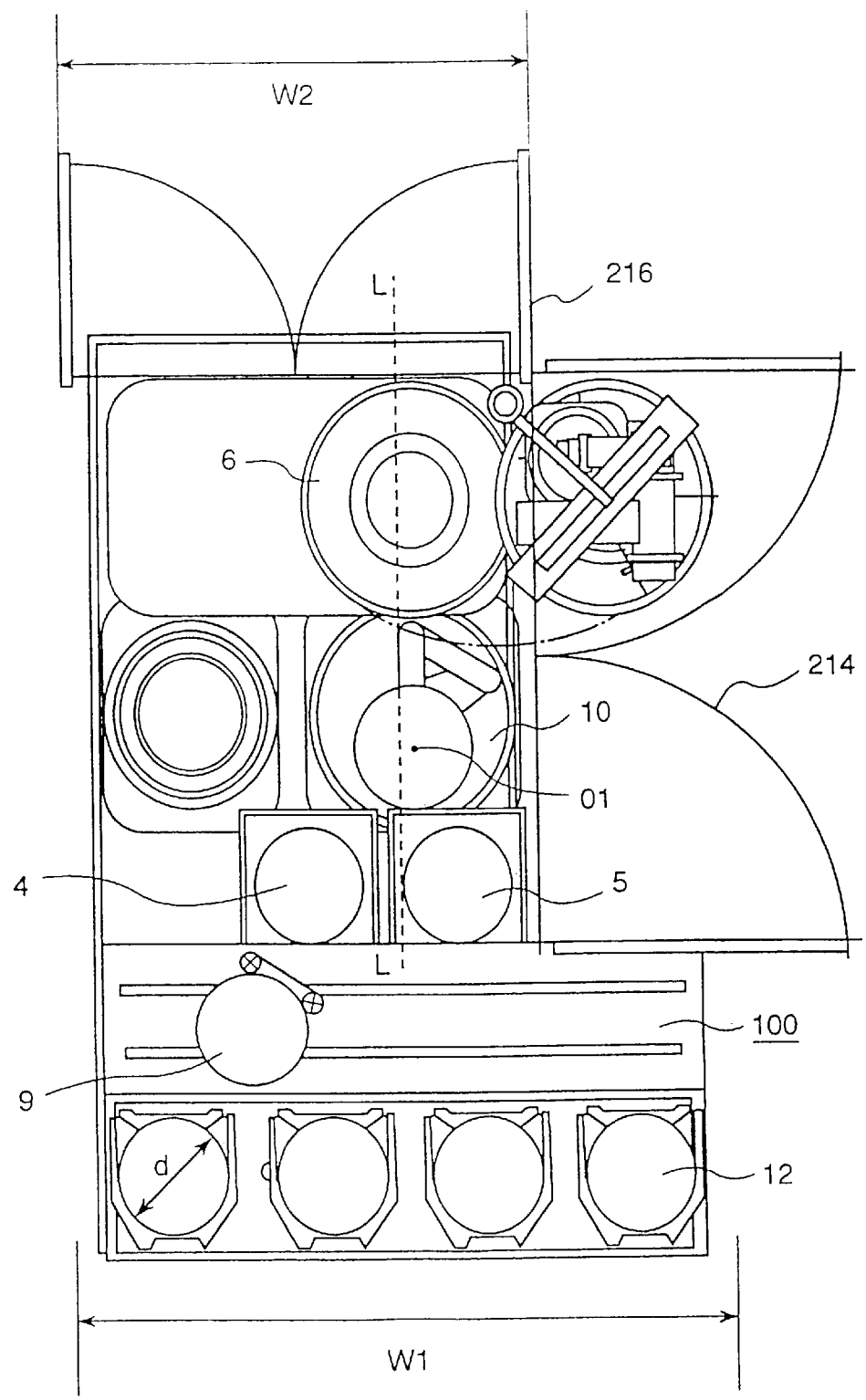
FIG. 10 is a view showing an example of the relative relationship of various kinds of elements inside a vacuum processing apparatus in accordance with the present invention.

An example of the mutual relationship of the various kinds of elements in the vacuum processing apparatus in accordance with the present invention will be described, referring to FIG. 10. As shown in the figure, the rotational center 01 of the arm of the vacuum transfer robot 10 is arranged on the right hand side or the left hand side of the line L—L connecting the middle position of the load lock chamber 4 and the unload lock chamber 5 and the center of the processing chamber 6, that is, the rotational center 01 is shifted toward the side of the vacuum processing portion. The post treating chamber 7 is arranged on the opposite side of the line L—L. Therefore, the rotating range of the arm of the vacuum transfer robot 10 is narrow, and the whole plan shape of the vacuum processing apparatus 100 can be made L-shaped by arranging the vacuum transfer robot 10 near the side of the vacuum processing portion. By such a construction, the rotation range of the arm of the vacuum transfer robot 10 becomes nearly one-half of one round circle. By limiting the rotating range of the arm of the vacuum robot 10 for transfer of a wafer to within nearly a semi-circle, one sample 3 can be transferred to the load lock chamber 4, the unload lock chamber 5 the processing chamber 6 and the post treating chamber 7 with nearly a semi-circle movement of the arm. As described above, since the rotating range of the arm of the vacuum transfer robot 10 is designed to be within nearly a semi-circle, the width W2 of the vacuum processing block 2 can be made narrow.

As described above, the vacuum processing apparatus 100 in accordance with the present invention makes available the aforementioned maintenance space by making the width W2 of the vacuum processing block 2 as small as possible by taking into consideration the shape of the various kinds of elements arranged in the vacuum processing apparatus and the mutual relationship of the various elements, while providing the width W1 of the cassette block 1 copes with the large diameter sample. By doing so, the effective occupied area of the vacuum processing apparatus 100 can be increased.

Since there is the maintenance space MS between the vacuum processing blocks 2, there is no obstacle to the operator opening the doors 214 in the side to perform maintenance work. Further, there is provided enough space in the back side of the vacuum processing block 2 to open the doors 216 and perform maintenance work.

Figure 11:
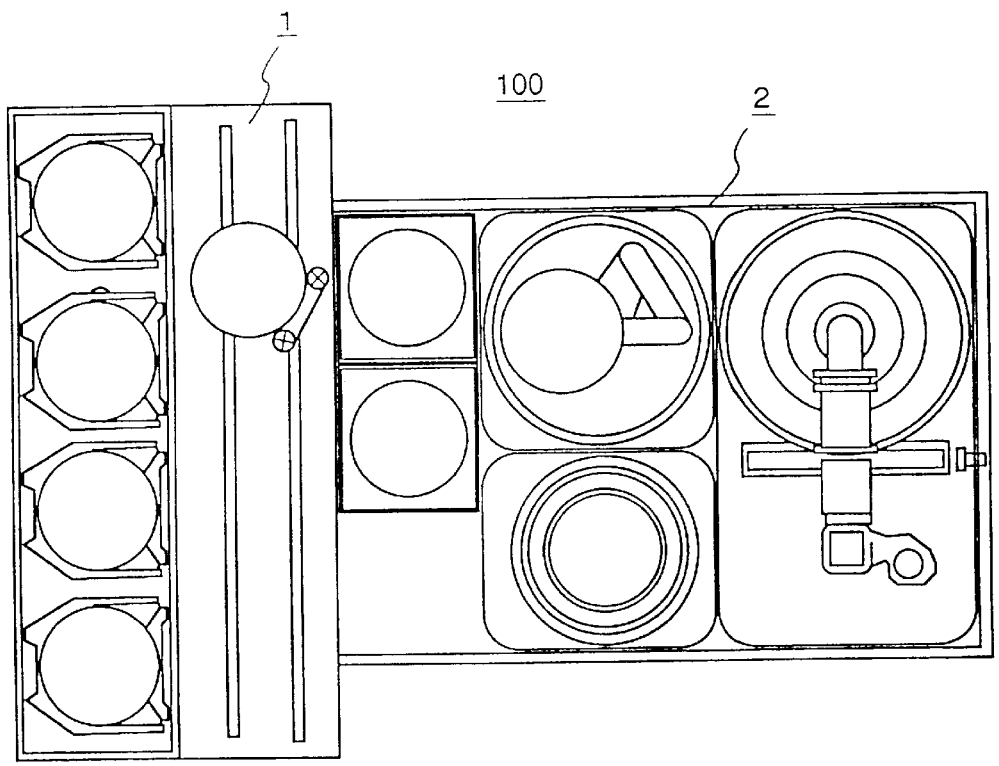
FIG. 11 is a plan view showing another embodiment of a vacuum processing apparatus in accordance with the present invention.
Figure 12:
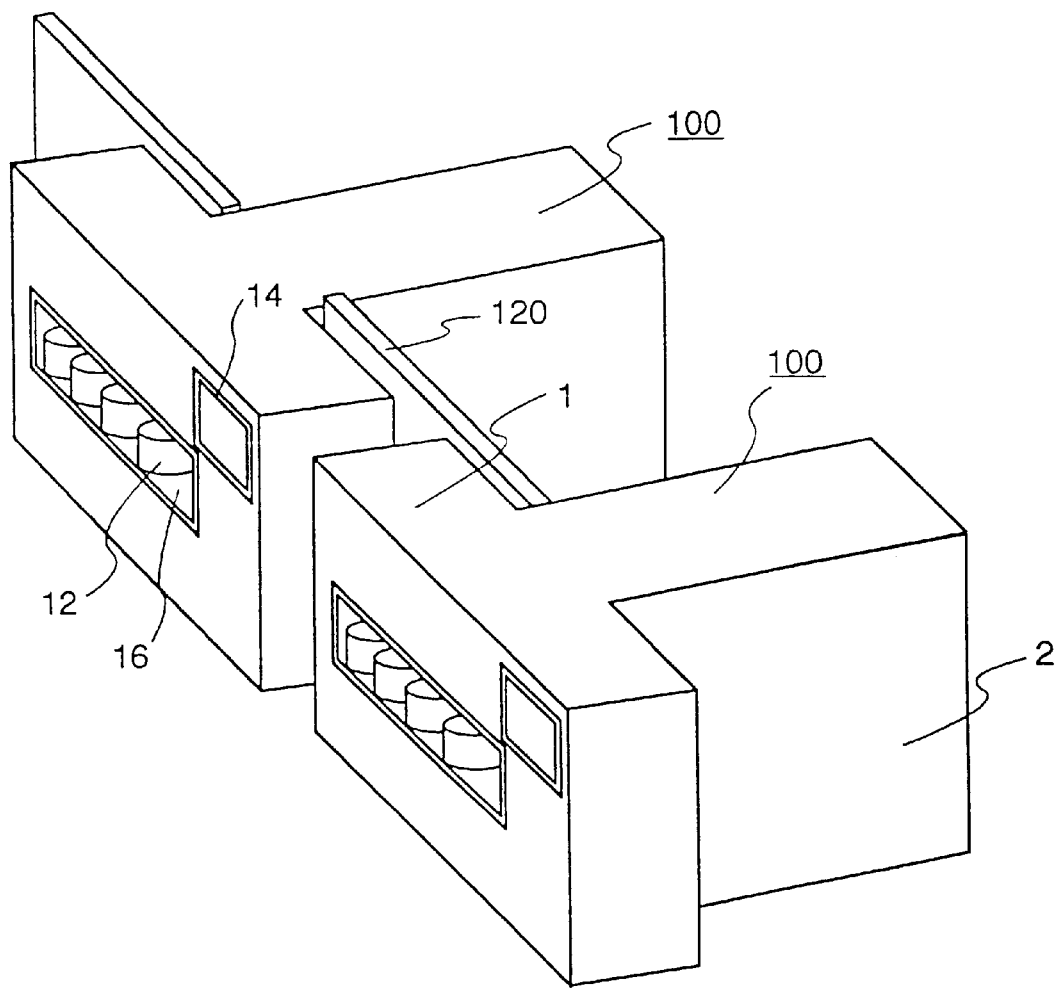
FIG. 12 is a perspective view showing the vacuum processing apparatus of FIG. 11.

In the vacuum processing apparatus 100 in accordance with the present invention, the positional relationship between the vacuum processing block 2 and the cassette block 1 can be changed along the lateral direction of the cassette block. For example, as shown in FIG. 11 and FIG. 12, the vacuum processing block 2 and the cassette block 1 are arranged so that the center line of the vacuum processing block 2 passes through the center of the cassette block 1 in the lateral direction, in other words, the vacuum processing block 2 and the cassette block 1 may be arranged so as to form a T-shape as seen in a top plan view. In the T-shape arrangement, since there is maintenance space MS between the vacuum processing blocks 2, here is no obstacle to the operator opening the doors 214 in the side to perform maintenance work.

Figure 13:
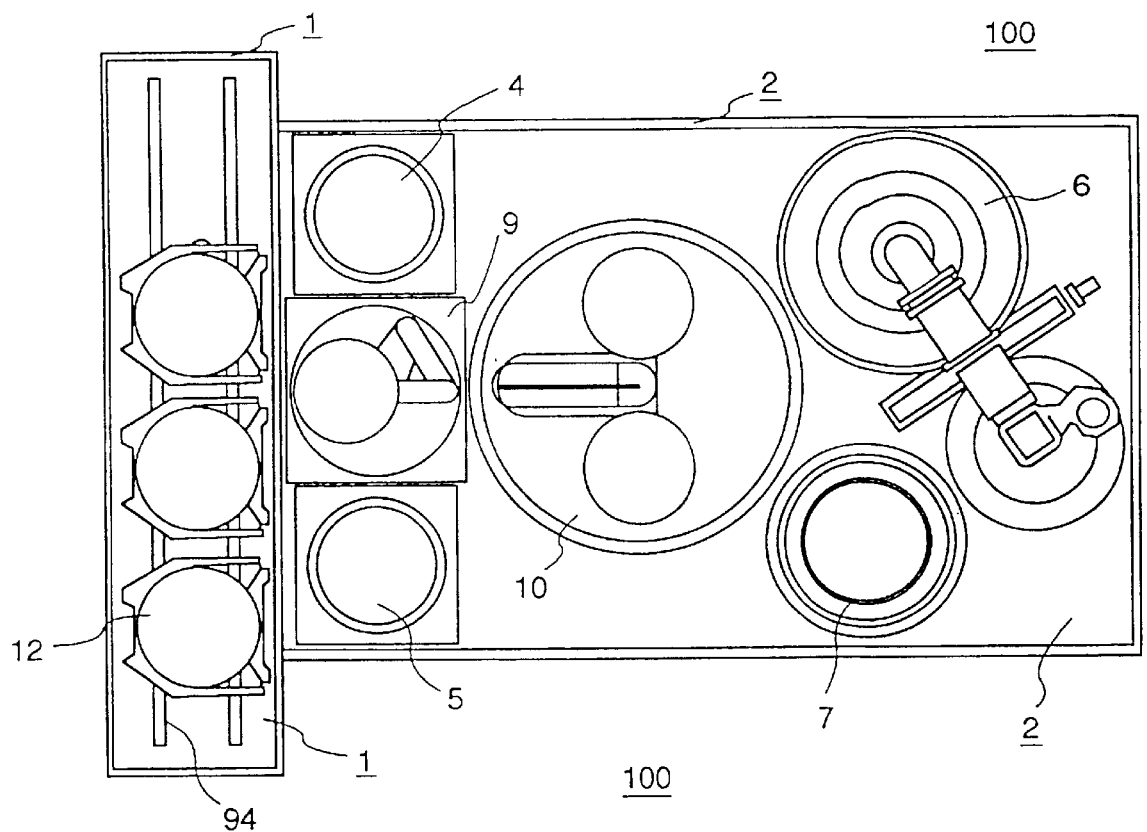
FIG. 13 is a plan view showing another embodiment of a vacuum processing apparatus in accordance with the present invention.

The plan view shape of the cassette block 1 and the vacuum processing block 2 in accordance with the present invention need be not strictly rectangular, that is, it may be nearly rectangular so long as the relation (W1+G1)−W2=MS can be practically maintained. The structural elements contained in the cassette block 1 and the vacuum processing block 2 and the arrangement of the structural elements may be different from those in the aforementioned embodiments. For example, in the embodiment shown in FIG. 13, the atmospheric transfer robot 9 of the cassette block 1 is placed between the load lock chamber 4 and the unload lock chamber 5 of the vacuum processing block. In this case, the plan view shape of the cassette block 1 is strictly a projecting shape and the plan view shape of the vacuum processing block 2 is strictly a recessed shape, and the whole of the vacuum processing apparatus 100 is a combination of two blocks of nearly rectangular shape forming a T-shape. In this embodiment, the locus of the extensible arm 91 can be constructed so as to trace the locus containing the cassette 12 and the load lock chamber 4 on the load side and the load lock chamber 5 in the unload side 5 without moving the atmospheric transfer robot 9 on the rail by placing the atmospheric transfer robot 9 of the cassette block 1 between the load lock chamber 4 and the unload lock chamber 5 of the vacuum processing block and movably arranging the cassette 12 on the rail 94. In this embodiment, the aforementioned maintenance space MS between the vacuum processing blocks 2 can be provided.

Figure 14:
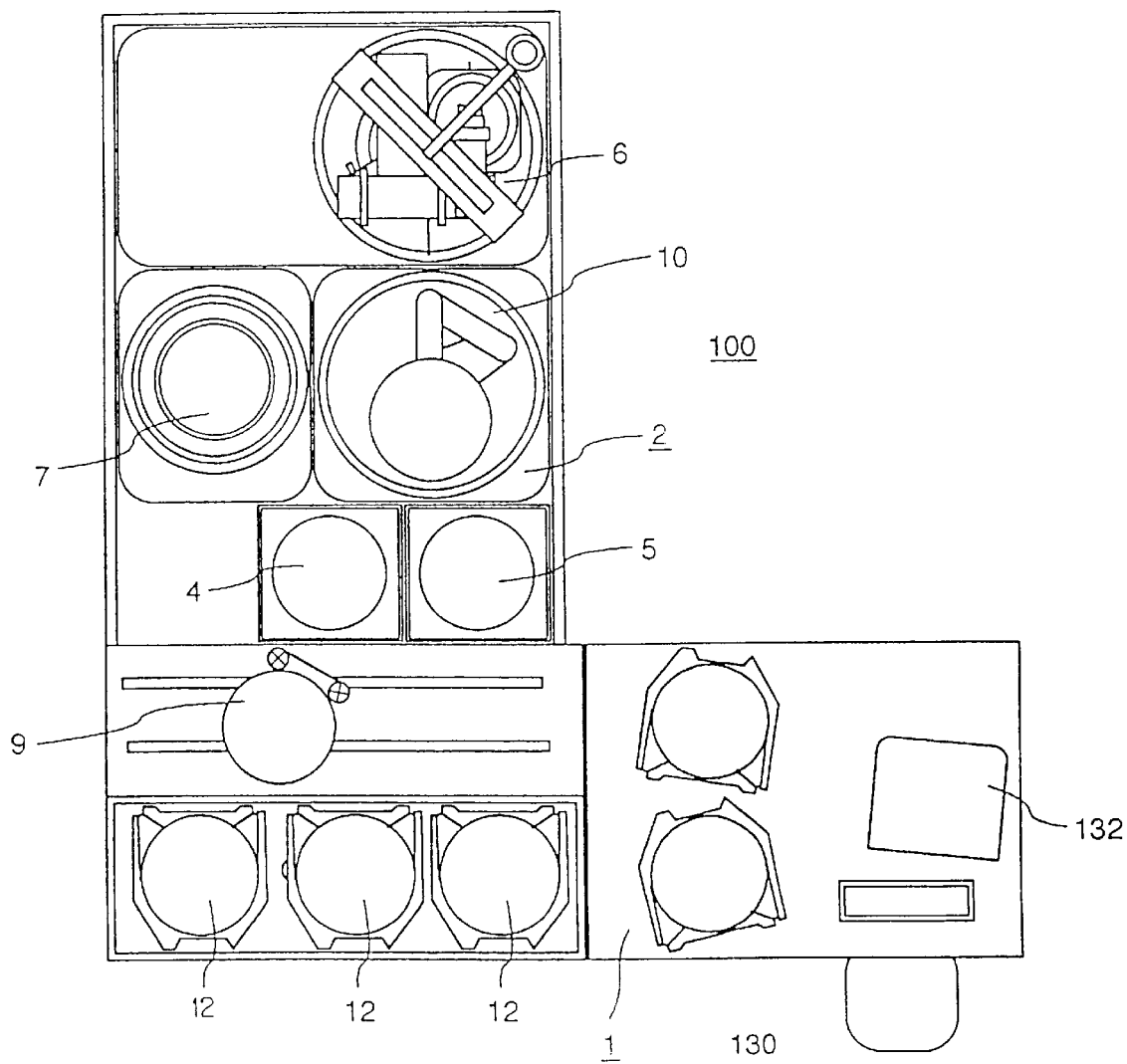
FIG. 14 is a plan view showing another embodiment of a vacuum processing apparatus in accordance with the present invention.

FIG. 14 shows another embodiment of a vacuum processing apparatus 100 in accordance with the present invention. The vacuum processing apparatus has a cassette mounting table 130 and a console box 132 for evaluating and inspecting a sample in addition to a cassette block 1, an atmospheric transfer robot 9 and a sample cassette 12.

Figure 15:
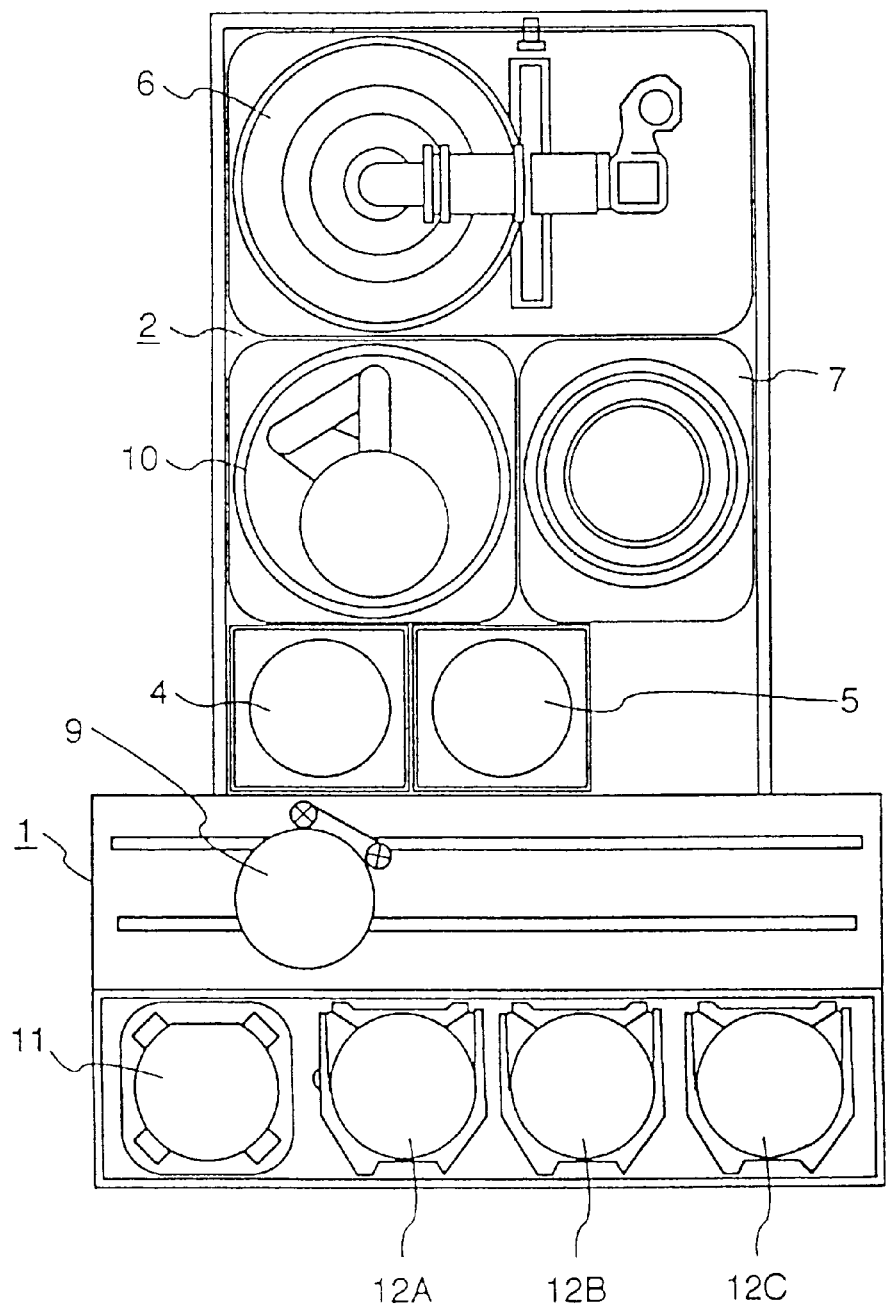
FIG. 15 is a plan view showing another embodiment of a vacuum processing apparatus in accordance with the present invention.

FIG. 15 shows a further embodiment of a vacuum processing apparatus 100 in accordance with the present invention. The vacuum processing apparatus is a T-shaped vacuum processing apparatus having a cassette block 1, an atmospheric transfer robot 9 and a sample orientation adjuster 11.

Figure 16:
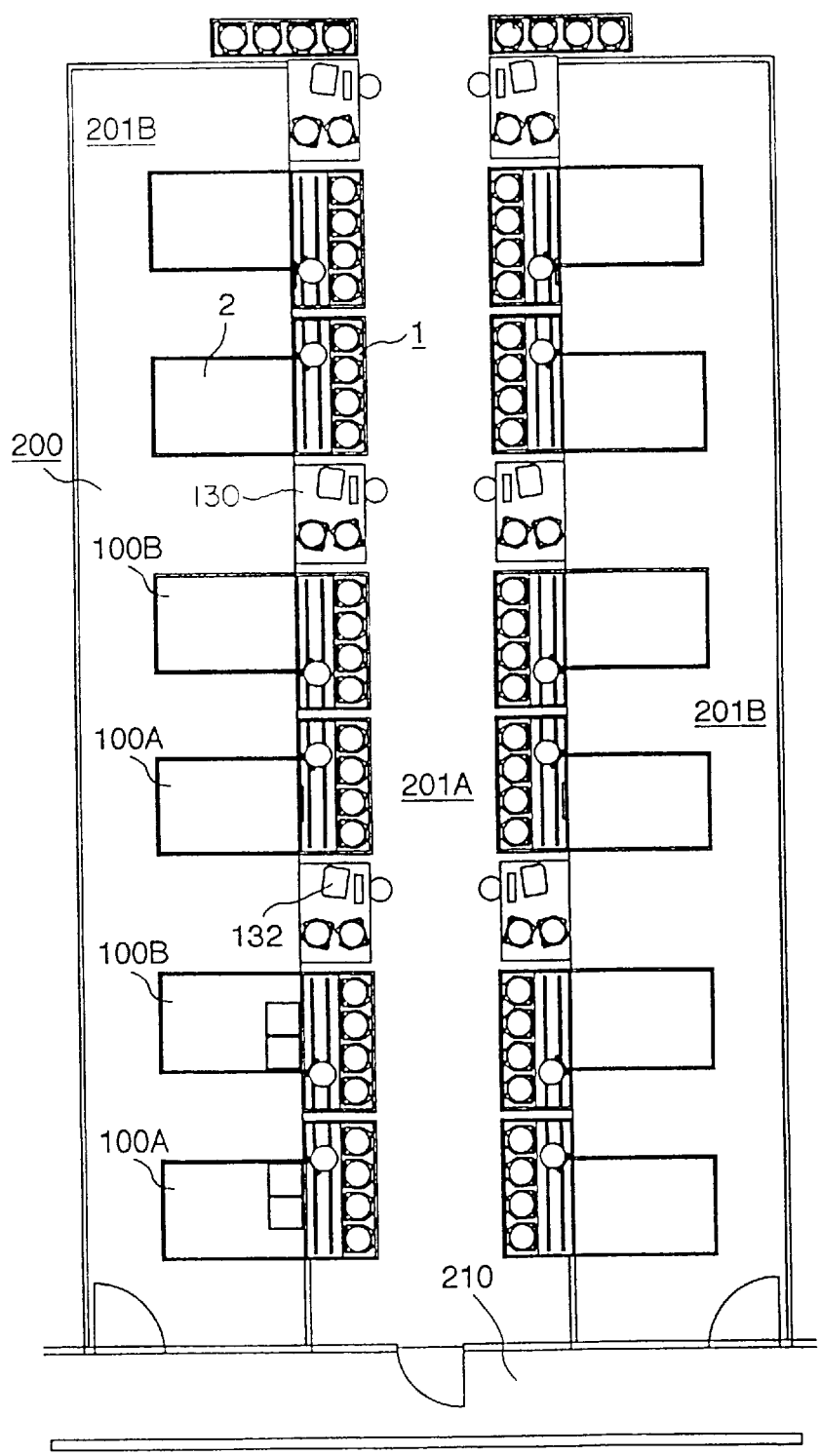
FIG. 16 is a plan view showing another arrangement of a bay area in accordance with the present invention.

FIG. 16 is a plan view showing another embodiment of a bay area 200 in accordance with the present invention. A pair of L-shaped vacuum processing apparatuses 100A, 100B are arranged opposite to each other to form a set, and a console table 130 with a console box 132 is placed between the sets. There is not the aforementioned gap G1, but (W1+W3)−W2=MS becomes the maintenance space when the width of the console table 130 is W3. Since there is no gap G1, an operator needs to enter the zone 201B in which the vacuum processing block 2 is located from the back of the bay area 200 through the maintenance path 210 in order to perform maintenance the vacuum processing block 2. If it is required to reduce the access time, a gap G1 may be provided between the console table 130 and the neighboring cassette block 1. In this case, (W1+W3+G1)–W2=MS becomes the maintenance space.

Figure 17:
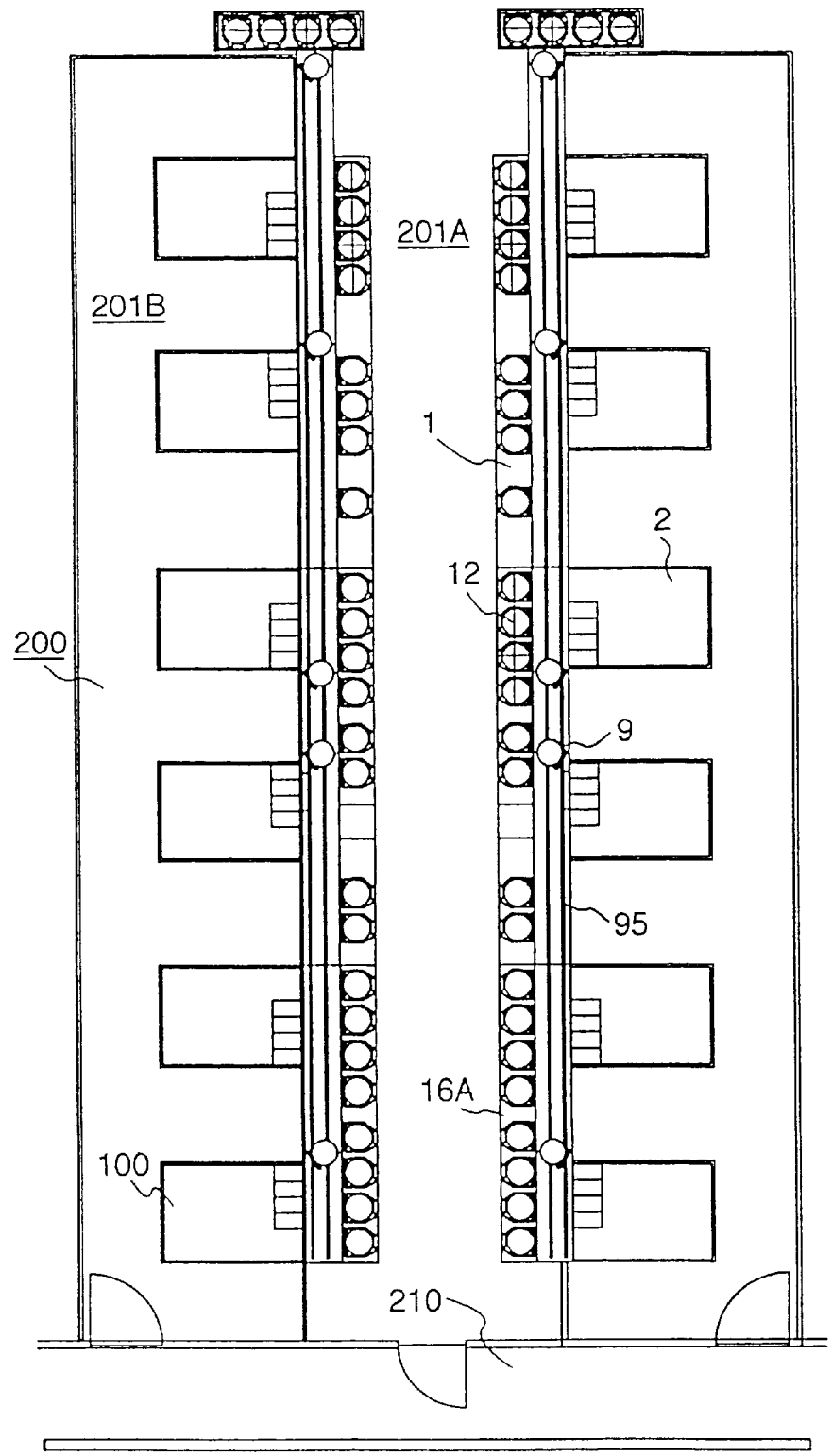
FIG. 17 is a plan view showing another arrangement of a bay area in accordance with the present invention.

FIG. 17 is a plan view showing a bay area having another arrangement of vacuum processing apparatuses in accordance with the present invention. In the vacuum processing apparatus 100 in this embodiment, cassette tables 16A for plural cassette blocks 1 are formed in a continuous one-piece structure, and a plurality of atmospheric transfer robots 9 run on a common rail 95 on the continuous cassette table. An in-bay automatic transfer machine is placed between the bar stoker and the atmospheric transfer robot 9 to transfer a sample between the vacuum processing blocks 2. In this case, a cassette block 1 functionally corresponds to each of the vacuum processing blocks 2 in one by one, relationship and it can be thought that a plurality of nearly rectangular blocks corresponding to the respective vacuum processing blocks 2 are connected together.

Figure 18:
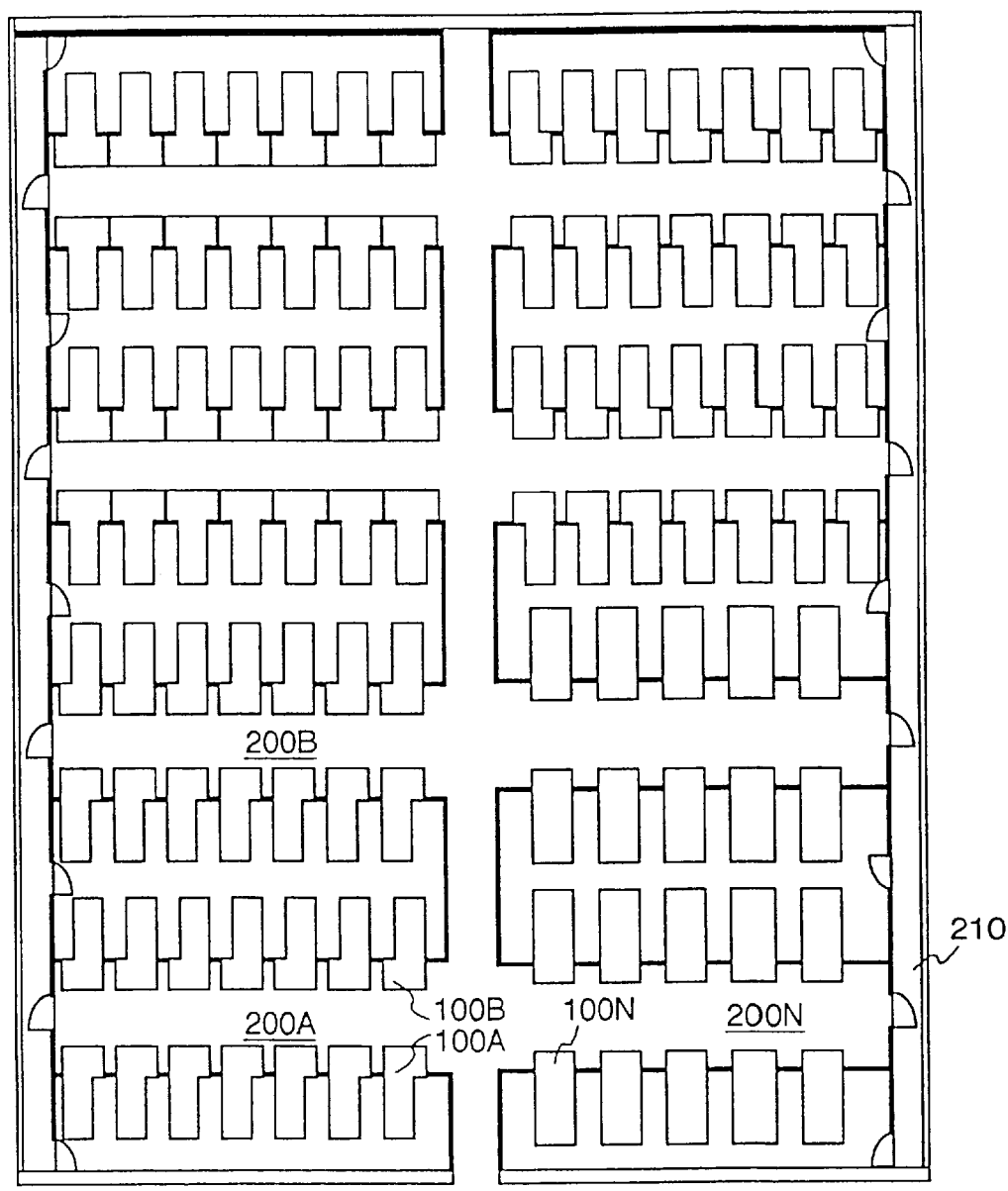
FIG. 18 is a plan view showing a semiconductor manufacturing line in accordance with the present invention.

FIG. 18 is a plan view showing the construction of an embodiment of a manufacturing line in accordance with the present invention. It can be understood from FIG. 18 that the vacuum processing apparatus 100 in accordance with the present invention is L-shaped or T-shaped in plan view shape and a sufficient maintenance space MS can be maintained between the vacuum processing blocks 2 even if a gap is provided between the vacuum processing apparatuses 100.

On the other hand, if a sufficient maintenance space is provided in the conventional rectangular vacuum processing apparatus 800 as shown in FIG. 9 for purpose of comparison, the gap between the vacuum processing apparatuses must be increased. As a result, the number of vacuum processing apparatuses which can be arranged in the same length of line is only five for the conventional rectangular vacuum processing apparatus 800 in comparison to seven for the vacuum processing apparatus 100 in accordance with the present invention as shown in the embodiment. A difference of two of vacuum processing apparatuses is large when the whole semiconductor manufacturing line is considered, and becomes a large difference in arranging a necessary number of apparatuses in a clean room having a given space and in a saving footprint. As for transferring of sample from a bay area having an automatic transfer machine to a bay area for the next process, when the vacuum processing apparatus in accordance with the present invention is employed, an amount of processing corresponding to seven vacuum processing apparatuses can be performed using one side of the one bay area. Whereas, when the conventional apparatus is employed, an amount of processing corresponding to only five vacuum processing apparatuses can be performed. This difference of two apparatuses results in a large improvement of the through-put in a semiconductor manufacturing line.

There are some cases where the rectangular vacuum processing apparatus 800 is required to be partially used. Even in such a case, by arranging the L-shaped or T-shaped vacuum processing apparatus 100 in accordance with the present invention adjacent to the rectangular vacuum processing apparatus 800, a proper maintenance space MS can be maintained between the vacuum processing blocks.

Figure 19:
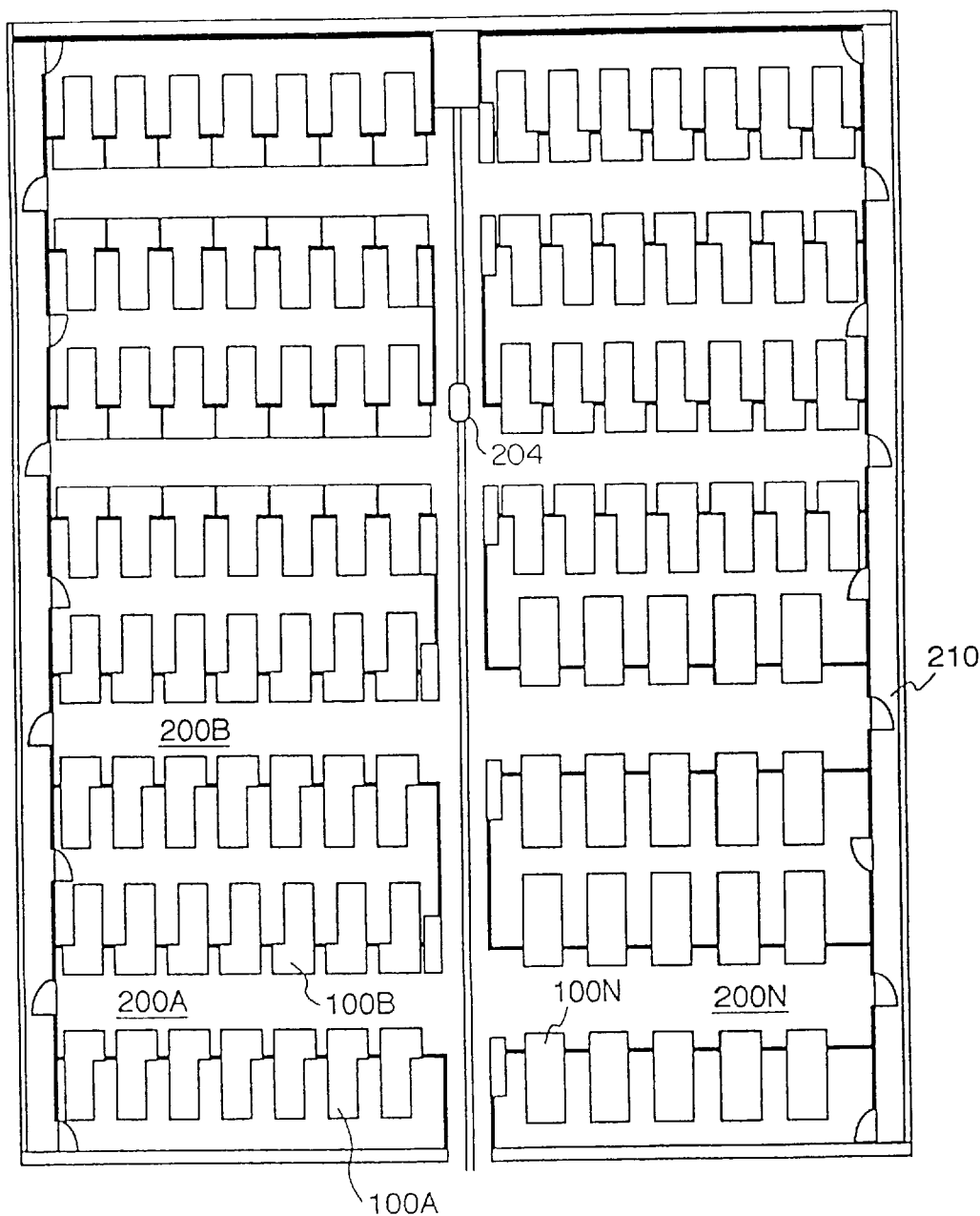
FIG. 19 is a plan view showing a semiconductor manufacturing line in accordance with the present invention.

FIG. 19 is a plan view showing the whole construction of another embodiment of a semiconductor manufacturing line in which the vacuum processing apparatuses in accordance with the present invention are partially employed. This semiconductor manufacturing line has a line automatic transfer machine 204 and is of a line automated type where transferring of a sample between each of the bay areas 200A to 200N and the line automatic transfer machine 204 is performed by an operator. In this system, the same effects as in the embodiment of FIG. 18 can be attained.

Figure 20:
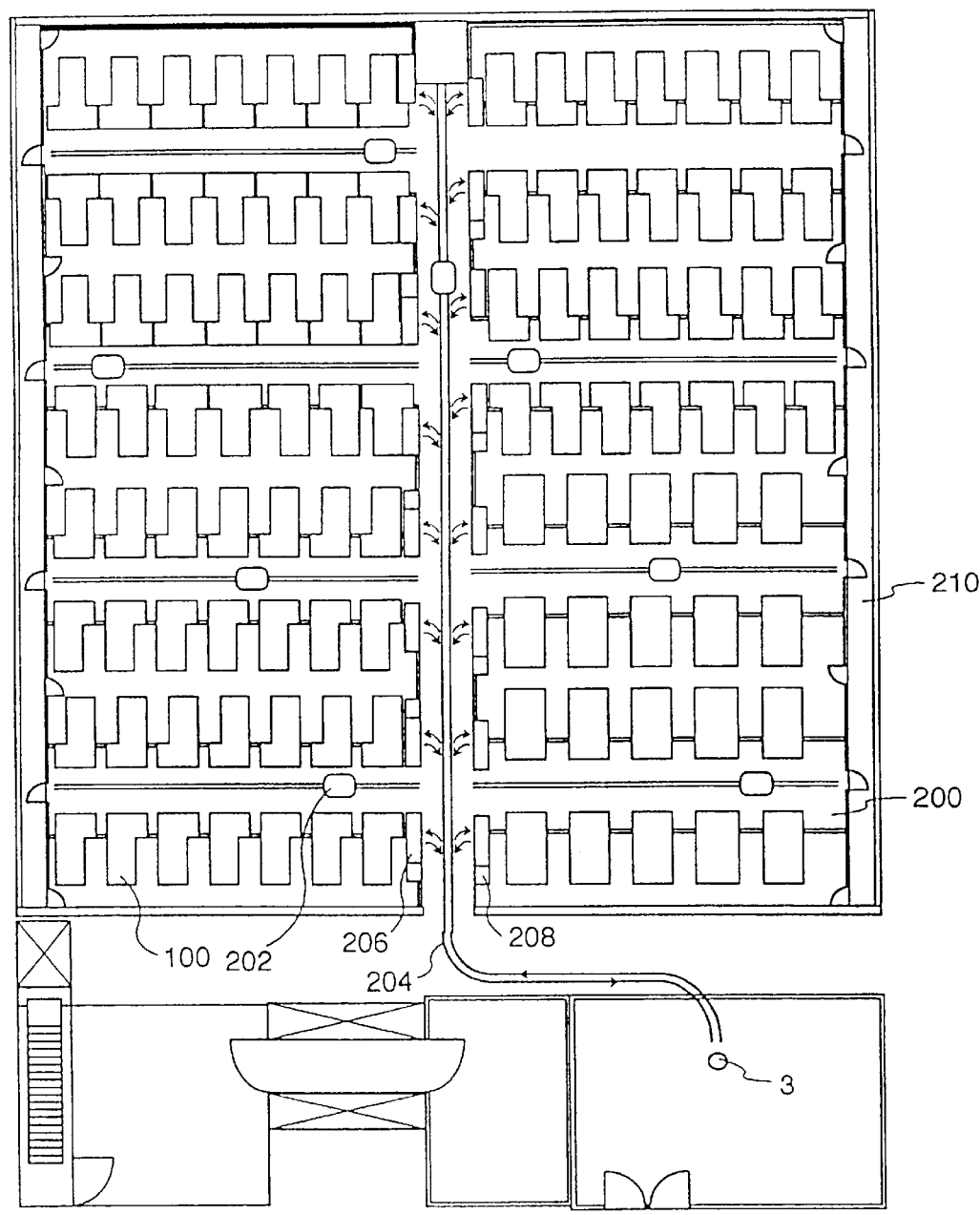
FIG. 20 is a plan view showing a semiconductor manufacturing line in accordance with the present invention.

FIG. 20 is a plan view showing the whole construction of a further embodiment of a semiconductor manufacturing line in which the vacuum processing apparatuses in accordance with the present invention are partially employed. This semiconductor manufacturing line has in-bay automatic transfer machines 202 and a line automatic transfer machine 204 and is of a fully automated type where the transferring of a sample inside each of the bay areas and between each of the bay areas 200A to 200N and the line automatic transfer machine 204 is performed without an operator. In this case, by arranging the L-shaped or T-shaped vacuum processing apparatuses 100 adjacent to each other or by arranging the L-shaped or T-shaped vacuum processing apparatus 100 in accordance with the present invention adjacent to a rectangular vacuum processing apparatus 800, a proper maintenance space MS can be maintained between the vacuum processing blocks.

Figure 21:
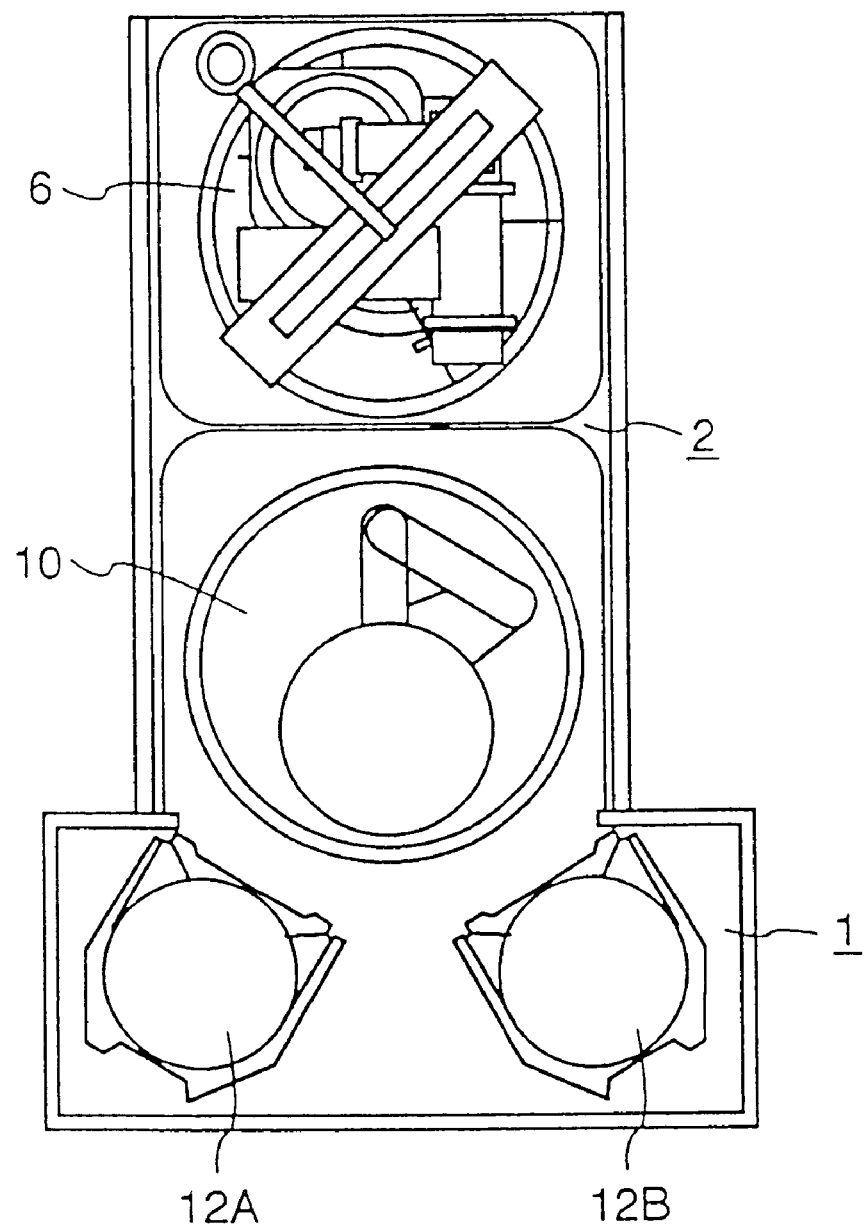
FIG. 21 is a plan view showing another embodiment of a vacuum processing apparatus in accordance with the present invention.
Figure 22:
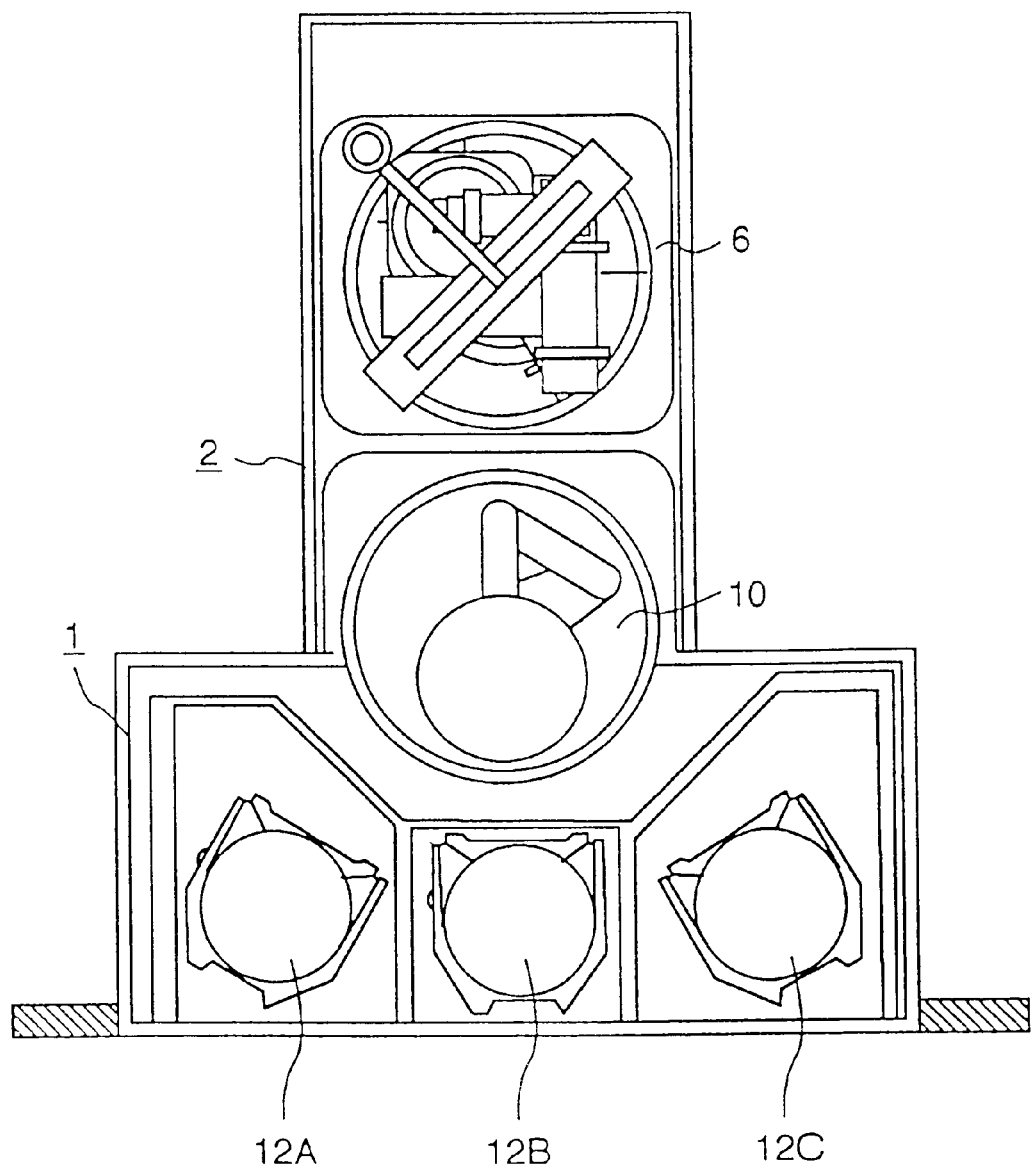
FIG. 22 is a plan view showing another embodiment of a vacuum processing apparatus in accordance with the present invention.

In the aforementioned embodiments, it has been described that the cassette and the atmospheric transfer robot are placed in an atmospheric environment and the atmospheric transfer robot is operated in an atmospheric environment. However, as shown in FIG. 21 and FIG. 22, it is possible for the cassette 12 to be placed in a vacuum environment and the transfer robot 10 to be operated in only a vacuum environment. FIG. 21 shows an embodiment where two cassettes 12 are employed, and FIG. 22 shows an embodiment where three cassettes 12 are employed. In both cases, the whole vacuum processing apparatus is of a T-shape.

In FIG. 21 and FIG. 22, the extraction of a sample in the cassette 12, the transferring of the extracted sample to the vacuum processing zone, the transferring of the sample from the vacuum processing zone and the storing of the sample to the original position in the cassette are performed under a vacuum environment using the vacuum transfer robot 10. In these cases, in regard to the vacuum processing system, there is no need for the load lock chamber and the unload lock chamber provided in the aforementioned embodiments, in principle. Therefore, the number of data elements successively updated by the host computer is reduced by the number of the data elements used for the load lock chamber and the unload lock chamber.

In this case, the state of samples contained in the cassette is performed by a wafer check means under a vacuum environment. Further, in an apparatus having an orientation adjusting means for an unprocessed sample, the orientation adjustment is performed under a vacuum environment.

Furthermore, in an apparatus having an intermediate cassette between the cassette and the vacuum processing zone, there are provided a robot for transferring the sample between the cassette and the intermediate cassette and a robot for transferring the sample between the intermediate cassette and the vacuum processing zone.

In such a vacuum processing system, since the intermediate cassette is added, the number of data elements successively updated by the host computer is increased by the number of the data elements used for the intermediate cassette and the robot.

Still further, in the aforementioned embodiments, the processed surface of a sample faces up and the sample is held horizontal in a state when the sample is contained in the cassette, in a state when the sample is transferred and in a state when the sample is vacuum-processed. However, another position of the sample is no problem.

As described above, according to the present invention, it is possible to provide a vacuum processing apparatus which is capable of coping with larger diameter samples and is capable of suppressing an increase in the manufacturing cost, and at the same time has a better maintainability.

Further, it is possible to provide a semiconductor manufacturing line which is capable of coping with larger diameter samples and at the same time is capable of suppressing an increase in manufacturing cost by maintaining a necessary installation number of vacuum processing apparatuses and not decreasing the maintainability by employing the vacuum processing apparatuses in accordance with the present invention in the semiconductor manufacturing line.

We claim:

1. A method of vacuum processing a sample comprising the steps of:
   (1) determining a position of said sample in a cassette, said cassette contains at least said sample and a dummy sample;
   (2) extracting said sample from said position in said cassette;
   (3) transferring said sample extracted out of said position in said cassette to a lock chamber;
   (4) a transferring said sample from said lock chamber to a vacuum processing zone;
   (5) performing vacuum processing of the transferred sample in the vacuum processing zone;
   (6) transferring the vacuum processed sample from said vacuum processing zone to said lock chamber;
   (7) transferring the vacuum processed sample out of said lock chamber;
   (8) transferring the vacuum processed sample to said cassette and storing said vacuum processed sample in the original position in said cassette;
   (9) vacuum processing said dummy sample in said vacuum processing zone and replacing the vacuum processed dummy sample into the original position in said cassette; and
   (10) successively updating management data on what designated id number sample each of the cassette, the lock chamber and the vacuum processing zone have in every movement of the sample and dummy sample from (1) to (9) above.

2. A method of vacuum processing a sample comprising the steps of:
   (1) determining a position of said sample in a cassette, said cassette contains at least said sample and a dummy sample;
   (2) transferring said sample from said position in the cassette to a vacuum processing zone;
   (3) performing vacuum processing of the transferred sample in the vacuum processing zone;
   (4) transferring the vacuum processed sample from said vacuum processing zone to said cassette and storing said vacuum processed sample in the original position in said cassette;
   (5) vacuum processing said dummy sample in said vacuum processing zone and replacing the vacuum processed dummy sample into the original position in said cassette; and
   (6) successively updating management data on what designated id number sample each of the cassette and the vacuum processing zone have in every movement of the sample and dummy sample from (1) to (5) above.

3. A method of vacuum processing a sample according to any one of claim 1 and claim 2, the method further comprising the step of:
   successively displaying the result of successively updating management data on a CRT screen of a vacuum processing system control unit.

4. A method of vacuum processing a sample according to any one of claim 1 and claim 2, the method further comprising the steps of:
   providing a plurality of said vacuum processing zones; and
   performing vacuum processing of said sample and dummy sample in series in each of said plurality of vacuum processing zones.

5. A method of vacuum processing a sample according to any one of claim 1 and claim 2, the method further comprising the steps of:
   providing a plurality of said vacuum processing zones;
   performing vacuum processing of a plurality of said samples in said plurality of vacuum processing zones in parallel; and
   managing and controlling which of said plurality of said samples is processed in each of said plurality of vacuum processing zones.

6. A method of vacuum processing according to claim 5, wherein each sample is vacuum processed in series in each of said plurality of vacuum processing zones.

7. A method of vacuum processing a sample according to any of claim 1 and claim 2, wherein said dummy sample is placed either at the uppermost or the lowermost stage of an accommodated sample stack in said cassette.

* * * * *